United States Patent
Yamamoto et al.

(10) Patent No.: US 12,482,788 B2
(45) Date of Patent: Nov. 25, 2025

(54) SEMICONDUCTOR DEVICE AND METHOD OF MANUFACTURING A SEMICONDUCTOR DEVICE

(71) Applicant: KIOXIA CORPORATION, Tokyo (JP)

(72) Inventors: Susumu Yamamoto, Yokkaichi Mie (JP); Tsutomu Fujita, Yokkaichi Mie (JP); Takeori Maeda, Mie Mie (JP); Satoshi Hongo, Yokkaichi Mie (JP); Gen Toyota, Yokkaichi Mie (JP); Eiichi Shin, Yokkaichi Mie (JP); Yukio Katamura, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 204 days.

(21) Appl. No.: 17/682,925

(22) Filed: Feb. 28, 2022

(65) Prior Publication Data

US 2022/0375901 A1    Nov. 24, 2022

(30) Foreign Application Priority Data

May 24, 2021    (JP) .................................. 2021-087166

(51) Int. Cl.
- *H01L 25/065* (2023.01)
- *H01L 23/552* (2006.01)
- *H01L 25/00* (2006.01)

(52) U.S. Cl.
CPC ........ *H01L 25/0657* (2013.01); *H01L 23/552* (2013.01); *H01L 25/50* (2013.01);
(Continued)

(58) Field of Classification Search
CPC ... H01L 25/0657; H01L 25/50; H01L 23/552; H01L 2225/06506; H01L 2225/06537;
(Continued)

(56) References Cited

U.S. PATENT DOCUMENTS

| | | |
|---|---|---|
| 8,331,121 B2 | 12/2012 | Hong |
| 9,716,080 B1 | 7/2017 | Chuang |

(Continued)

FOREIGN PATENT DOCUMENTS

| | | |
|---|---|---|
| JP | 2003229449 A | 8/2003 |
| JP | 2004297054 A | 10/2004 |

(Continued)

OTHER PUBLICATIONS

Ryuichiro Mitani, "Eddy current type sensor for CMP end point detection monitor and its application", Ebara Newsletter No. 234, Jan. 2012, 10 pages, URL: https://www.ebara.co.jp/jihou/archive/year/detail/_icsFiles/afieldfile/2021/09/22/234_02.pdf (https://www.ebara.co.jp/about/technologies/abstract/detail/1196370_4292.html).

(Continued)

*Primary Examiner* — Timor Karimy
(74) *Attorney, Agent, or Firm* — Kim & Stewart LLP

(57) ABSTRACT

According to one embodiment, a method of manufacturing a semiconductor device includes forming a plurality of stacked bodies on a substrate, each of the stacked bodies includes a plurality of semiconductor chips. The method further includes forming a plurality of first wires on the stacked bodies. The first wires connecting the stacked bodies to each other. The method further includes forming a resin layer on the stacked bodies and the first wires, then thinning he resin layer until the first wires are exposed.

20 Claims, 35 Drawing Sheets

(52) U.S. Cl.
CPC ............... *H01L 2225/06506* (2013.01); *H01L 2225/06537* (2013.01); *H01L 2225/06562* (2013.01); *H01L 2225/06586* (2013.01)

(58) Field of Classification Search
CPC  H01L 2225/06562; H01L 2225/06586; H10B 80/00
See application file for complete search history.

(56) References Cited

U.S. PATENT DOCUMENTS

| | | | |
|---|---|---|---|
| 10,128,211 B2* | 11/2018 | Chang | ..................... H01L 24/96 |
| 11,387,810 B2 | 7/2022 | Onodera | |
| 11,597,051 B2 | 3/2023 | Togawa | |
| 2009/0014890 A1* | 1/2009 | Takahashi | ........... H01L 25/0657 |
| | | | 257/E23.141 |
| 2016/0322326 A1 | 11/2016 | Katkar | |
| 2017/0110439 A1 | 4/2017 | Yuan et al. | |
| 2017/0186737 A1 | 6/2017 | Fang et al. | |
| 2017/0287870 A1* | 10/2017 | Fang | ..................... H01L 23/552 |
| 2019/0273067 A1 | 9/2019 | Xu | |
| 2020/0273844 A1 | 8/2020 | Hirano | |
| 2021/0074679 A1* | 3/2021 | Lee | ....................... H01L 23/585 |
| 2021/0082895 A1 | 3/2021 | Miura | |

FOREIGN PATENT DOCUMENTS

| | | |
|---|---|---|
| JP | 2010251762 A | 11/2010 |
| JP | 2011049412 A | 3/2011 |
| JP | 2016505222 A | 2/2016 |
| JP | 2019047022 A | 3/2019 |
| JP | 2020102758 A | 7/2020 |
| JP | 2020141126 A | 9/2020 |
| TW | 201743420 A | 12/2017 |
| TW | 202114083 A | 4/2021 |

OTHER PUBLICATIONS

Japanese Office Action dated Jan. 31, 2025, mailed in counterpart Japanese Application No. 2021-087166, 13 pages (with translation).
Japanese Office Action dated Nov. 12, 2024, mailed in counterpart Japanese Application No. 2021-087166, 30 pages (with translation).

* cited by examiner

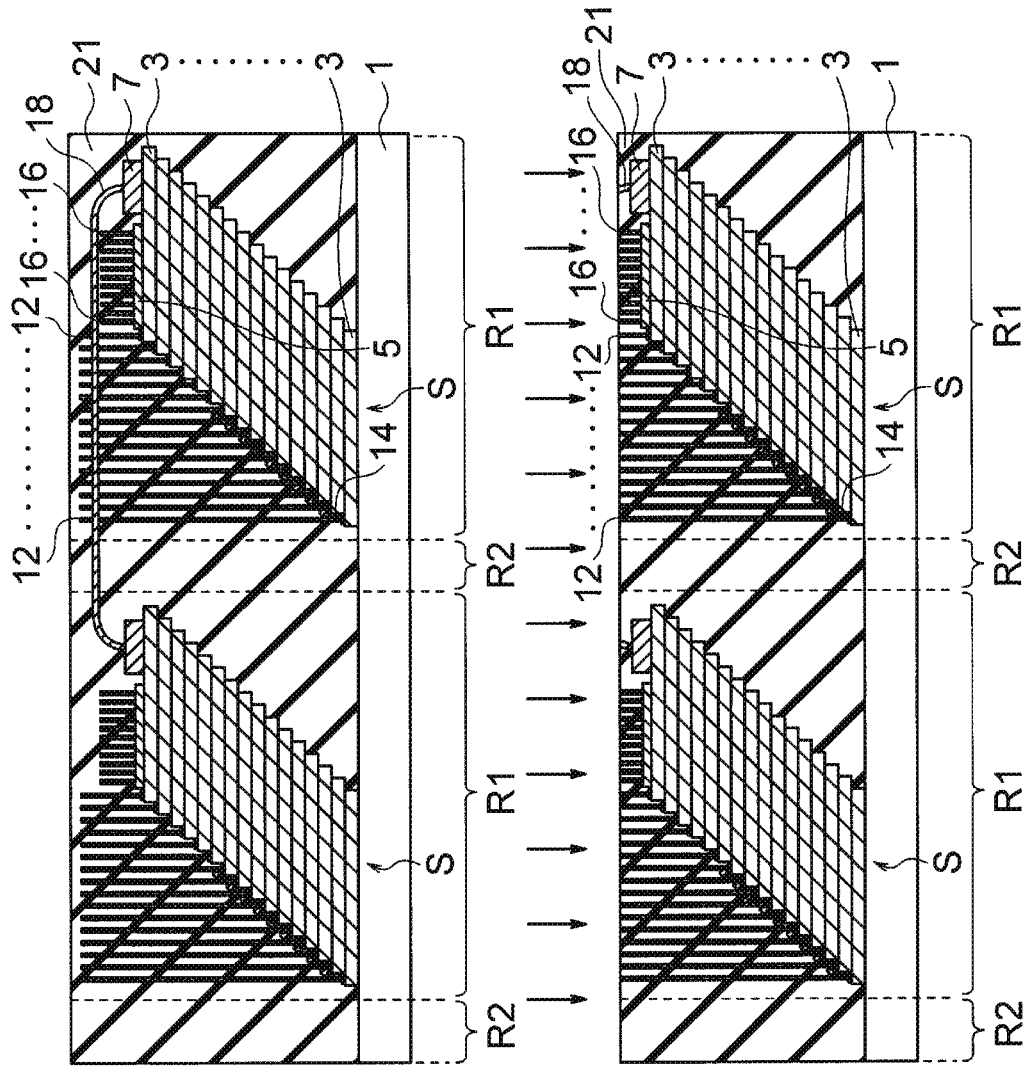
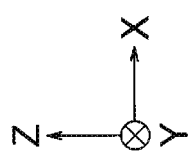
FIG. 2A
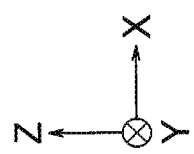
FIG. 2B

SEMICONDUCTOR DEVICE AND METHOD OF MANUFACTURING A SEMICONDUCTOR DEVICE

CROSS-REFERENCE TO RELATED APPLICATION

This application is based upon and claims the benefit of priority from Japanese Patent Application No. 2021-087166, filed May 24, 2021, the entire contents of which are incorporated herein by reference.

FIELD

Embodiments described herein relate generally to a semiconductor device and a method of manufacturing a semiconductor device.

BACKGROUND

When a resin layer is to be formed on a semiconductor chip, the method to be used for forming the resin layer can be a problem. For example, when the resin layer on the semiconductor chip is to be polished or ground, the method of detecting an end point for polishing or grinding can be a problem.

BRIEF DESCRIPTION OF THE DRAWINGS

FIGS. 2A and 2B are cross-sectional views illustrating aspects related to a method of manufacturing a semiconductor device according to a first embodiment.

DETAILED DESCRIPTION

Figure 1:
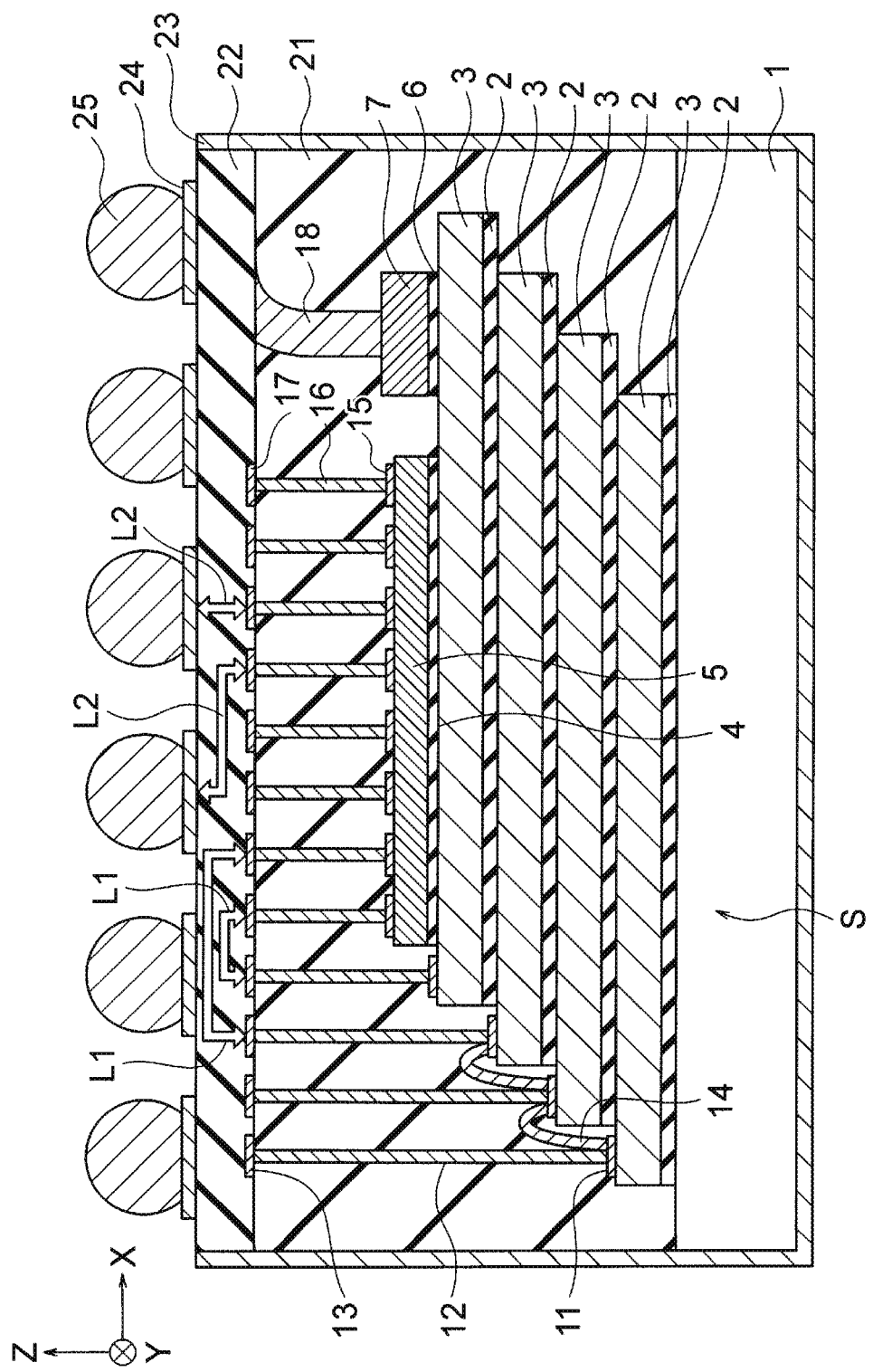
FIG. 1 is a cross-sectional view of a semiconductor device according to a first embodiment.

Embodiments provide a semiconductor device in which a resin layer can be appropriately formed on a semiconductor chip and a method of manufacturing the same.

In general, according to one embodiment, a method of manufacturing a semiconductor device includes forming a plurality of stacked bodies on a substrate. The stacked bodies include a plurality of semiconductor chips. A plurality of first wires are then formed to connect the stacked bodies to each other. A resin layer is then formed on the stacked bodies and the first wires. Subsequently, portions of the resin layer are removed until the first wires are exposed at an upper surface of the resin layer.

Hereinafter, certain example embodiments of the present disclosure will be described with respect to the drawings. In the drawings, the same or substantially same components or aspects are represented by the same reference numerals, and the detailed description of such repeated components or aspects may be omitted after an initial description.

First Embodiment

FIG. 1 is a cross-sectional view illustrating a structure of a semiconductor device according to a first embodiment.

The semiconductor device illustrated in FIG. 1 includes a substrate 1 and a stacked body S. The stacked body S includes a plurality of memory chips 3, a controller chip 5, and a metal piece 7 (metal plate). FIG. 1 further illustrates: an adhesive layer 2 that is disposed on a lower surface of each of the memory chips 3; an adhesive layer 4 that is disposed on a lower surface of the controller chip 5; and an adhesive layer 6 that is disposed on a lower surface of the metal piece 7. Each of the memory chips 3 and the controller chip 5 is an example of a semiconductor chip. Each of the memory chips 3 is an example of a first semiconductor chip, and the controller chip 5 is an example of a second semiconductor chip.

The semiconductor device illustrated in FIG. 1 further includes a plurality of metal pads 11, a plurality of vertical wires 12, a plurality of metal pads 13, a plurality of bonding wires 14, a plurality of metal pads 15, a plurality of metal pillars 16, a plurality of metal pads 17, a bonding wire 18, a resin layer 21, a redistribution layer (RDL) 22, a shield layer 23, a plurality of metal pads 24, and a plurality of metal bumps 25. The bonding wire 18 is an example of a first wire, and the vertical wires 12 are an example of a second wire. The redistribution layer 22 is an example of a first redistribution layer, and the shield layer 23 is an example of a metal layer.

In FIG. 1, the X direction and the Y direction are parallel to a surface of the substrate 1, and the Z direction is perpendicular to the surface of the substrate 1. In the present description, a +Z direction is considered as an upward direction, and a −Z direction is considered as a downward direction. The −Z direction may match with the gravity direction but such is not required. The Z direction is the stacking direction of the stacked body S.

The substrate 1 is, for example, a semiconductor substrate such as a silicon substrate or an insulating substrate such as a glass substrate. In FIG. 1, the plurality of memory chips 3 are stacked on the substrate 1, and the controller chip 5 and the metal piece 7 are stacked on the uppermost memory chip 3. The bottommost memory chip 3 is bonded to the substrate 1 by an adhesive layer 2. The other memory chips 3 are bonded to another memory chip by an adhesive layer 2 therebetween. The controller chip 5 is bonded to the uppermost memory chip 3 by the adhesive layer 4. The metal piece 7 is bonded to the uppermost memory chip 3 by the adhesive layer 6. These adhesive layers 2, 4, and 6 are, for example, die attachment films (DAF) but may be other adhesive materials. The metal piece 7 may be located directly on the uppermost memory chip 3 without the adhesive layer 6 therebetween.

Each of the memory chips 3 includes a memory cell array including a plurality of memory cells. These memory cells may be formed of a charge storage layer or a channel semiconductor layer that extends in the Z direction. That is, these memory cells may form memory cell arrays of a three-dimensional semiconductor memory. The plurality of memory chips 3 in the present embodiment have substantially the same shape. Accordingly, the memory chips 3 have substantially the same area in a plan view, that is, substantially have the same area and planar shape when seen from the top. In addition, the memory chips 3 are stacked in a shifted or offset manner from each other in the X direction. Accordingly, the metal pads 11 can be located on the upper surfaces of memory chips 3 at a position not covered by another memory chip 3.

The controller chip 5 functions as a controller that controls operations of each of the memory chips 3. This controller is formed of, for example, a CMOS circuit. The controller chip 5 in this embodiment has a planar area that is less than a planar area of each of the memory chips 3. In addition, the thickness (dimension in the Z direction) of the controller chip 5 is less than the thickness of each of the memory chips 3 in this example.

The metal piece 7 is used as a metal pad for the bonding wire 18. The metal piece 7 is formed of, for example, a metal such as aluminum (Al) or copper (Cu). The metal piece 7 according to the embodiment has a planar area that is less than the planar area of a memory chips 3. In addition, the thickness of the metal piece 7 according to the embodiment is set to be, for example, 1 μm or more. More specifically, in this example, the thickness of the metal piece 7 is set to be about 30 μm.

The metal pads 11 are disposed on the memory chips 3. In FIG. 1, one vertical wire 12 is disposed on each metal pad 11. One metal pad 13 is provided for each vertical wire 12. Accordingly, each of the vertical wires 12 includes a lower end electrically connected to the metal pad 11 and an upper end electrically connected to the metal pad 13. The vertical wires 12 are electrically connected to the memory chips 3 through a metal pad 11 and to the redistribution layer 22 through a metal pad 13. Each of the vertical wires 12 extends in the Z direction from a metal pad 11 to a metal pad 13, that is, extends in a direction perpendicular to the surface of the substrate 1. Each of the vertical wires 12 is formed of, for example, a metal such as gold (Au), silver (Ag), or copper (Cu).

Each of the bonding wires 14 connects to two metal pads 11 and electrically connects these metal pads 11 to each other. Each of the bonding wires 14 electrically connect, for example, one memory chip 3 in the stacked body S and another memory chip 3 in the stacked body S. Each of the bonding wires 14 is formed of, for example, a metal such as gold (Au), silver (Ag), or copper (Cu). The semiconductor device according to the first embodiment may include not only the bonding wires 14 in a XZ cross-section shown in FIG. 1 but also other bonding wires 14 outside the XZ cross-section shown in FIG. 1.

Each of the metal pads 15 is disposed on the controller chip 5. In FIG. 1, one metal pillar 16 is disposed on each metal pad 15, and each metal pillar 16 is connected to one metal pad 17. Accordingly, each of the metal pillars 16 includes a lower end electrically connected to the metal pad 15 and an upper end electrically connected to the metal pad 17. Each of the metal pillars 16 is electrically connected to the controller chip 5 through a metal pad 15, and to the redistribution layer 22 through a metal pad 17. Each of the metal pillars 16 extends in the Z direction from a metal pad 15 to a metal pad 17. Each of the metal pillars 16 is formed of, for example, a metal such as copper (Cu), tin (Sn), or a tin-silver alloy (SnAg). For example, each of the metal pillars 16 is formed by plating of a metal. Each of the metal pillars 16 may be formed of a single metal layer or may be formed of a plurality of metal layers. The metal pillar 16 may be formed using the same method as that of the vertical wire 12 in some examples. In a plan view, the plurality of metal pillars 16 may be disposed at a higher density (closer arrangement pitch) than that of the plurality of vertical wires 12.

The bonding wire 18 is disposed on the metal piece 7 and extends from an upper surface of the metal piece 7 to an upper surface of the resin layer 21. Accordingly, the bonding wire illustrated in FIG. 1 includes a lower end electrically connected to the metal piece 7 and an upper end in contact with the redistribution layer 22. The bonding wire 18 is formed of, for example, a metal such as gold (Au), silver (Ag), or copper (Cu). The bonding wire 18 according to this embodiment extends in the Z direction like the vertical wire 12 but is used for an application different from that of the vertical wire 12. Accordingly, the bonding wire 18 may have a shape or material characteristics different from those of the vertical wires 12. For example, the bonding wire 18 may have a diameter larger than that of a vertical wire 12 or may be formed of a material different from that of the vertical wires 12.

When the semiconductor device according to the first embodiment is manufactured, a plurality of stacked bodies S are formed on the substrate 1, and a plurality of bonding wires 18 that connect the stacked bodies S to each other are provided. The resin layer 21 is formed on the stacked bodies S and the bonding wires 18. In a subsequent process step the upper surface of the resin layer 21 is polished or ground. At this time, the bonding wires 18 can be used for detecting an end point of the polishing or grinding. FIG. 1 illustrates the portion of a bonding wire 18 left remaining after the polishing or grinding.

In the first embodiment, the vertical wires 12 are disposed for electrically connecting the memory chips 3 and the redistribution layer 22 to each other. The bonding wires 18 are used just for detecting an end point of polishing or grinding of the resin layer 21. In order to easily detect an end point of polishing or grinding, the bonding wire 18 may have shape characteristics or material characteristics different from those of the vertical wire 12. Additional details of an end point detection method using the bonding wires 18 will be described below.

The resin layer 21 is formed on the substrate 1 and the stacked body S. The vertical wires 12, the bonding wires 14, the metal pillars 16, the bonding wire 18, and the like are inside the resin layer 21. The resin layer 21 may be formed of any resin. The resin of which the resin layer 21 is formed is also called a mold resin. The resin layer 21 according to this embodiment is formed of an insulator.

The redistribution layer 22 is disposed on the resin layer 21. The redistribution layer 22 includes a plurality of insulating films and a plurality of wiring layers. The wiring layers form a multi-layer wiring structure. On the other hand, at least a part of the insulating films of the redistribution layer 22 are formed of, for example, a resin. FIG. 1 schematically illustrates a plurality of wirings L1 and L2 in the redistribution layer 22. Each of the wirings L1 electrically connects a vertical wire 12 and a metal pillar 16 to each other. Each of the wirings L2 electrically connects a metal pillar 16 and a metal bump 25 to each other.

The shield layer 23 is formed on a lower surface of the substrate 1 and on side surfaces of the substrate 1, the resin layer 21, and the redistribution layer 22. The shield layer 23 functions as, for example, an electromagnetic shield of the semiconductor device. The shield layer 23 is formed of, for example, a plurality of metal layers.

Each of the metal pads 24 is disposed on the redistribution layer 22. In FIG. 1, one metal bump 25 is disposed on each metal pad 24. Each of the metal bumps 25 is, for example, electrically connected to the controller chip 5 through the metal pad 24, the wiring L2, and the metal pillar 16. Each of the metal bumps 25 is used for electrically connecting the semiconductor device to another device.

FIGS. 2A and 2B are cross-sectional views illustrating a method of manufacturing the semiconductor device according to the first embodiment.

First, the substrate 1 is prepared, and a plurality of stacked bodies S are formed on the substrate 1 (FIG. 2A). The substrate 1 illustrated in FIG. 2A is, for example, a semiconductor substrate or an insulating substrate having a shape of a wafer. Each of the stacked bodies S is formed by stacking a plurality of memory chips 3 on the substrate 1 and stacking the controller chip 5 and the metal piece 7 on the uppermost memory chip 3. Each of the memory chips 3 is located on the substrate 1 or anther memory chip 3 through the adhesive layer 2. The controller chip 5 is located on the uppermost memory chip 3 through the adhesive layer 4. The metal piece 7 is located on the uppermost memory chip 3 through the adhesive layer 6. FIG. 2A illustrates just two stacked bodies S among the plurality of stacked bodies S.

A plurality of metal pads 11, a plurality of vertical wires 12, a plurality of bonding wires 14, a plurality of metal pads 15, a plurality of metal pillars 16, and a plurality of bonding wires 18 are formed (FIG. 2A). FIG. 2A does not specifically illustrate the metal pads 11 and 15 for reasons of depictional clarity. In addition, FIG. 2A illustrates just one bonding wire 18 among the plurality of bonding wires 18. The bonding wire 18 illustrated in FIG. 2A includes one end portion located on the metal piece 7 of one stacked body S; and another end portion located on the metal piece 7 of another stacked body S. The bonding wire 18 illustrated in FIG. 2A connects the two stacked bodies S to each other. The bonding wire 18 extends in the X direction between adjacent stacked bodies S. The vertical wires 12 extend primarily in the Z direction due to the stiffness of the vertical wires 12.

In FIG. 2A, the vertical wires 12 and the bonding wire 18 are illustrated as overlapping each other. However, the vertical wires 12 and the bonding wire 18 are not in actual contact with each other. In addition, the metal pillars 16 and the bonding wire 18 are not in contact with each other.

Next, the resin layer 21 is formed on the substrate 1 and the stacked bodies S (FIG. 2A). As a result, the stacked bodies S are covered with the resin layer 21. Likewise, the metal pads 11, the vertical wires 12, the bonding wires 14, the metal pads 15, the metal pillars 16, and the bonding wire 18 are also covered with the resin layer 21 at this time.

Next, the upper surface of the resin layer 21 is polished or ground (FIG. 2B). As a result, the resin layer 21 is gradually removed from the upper surface such that the upper surface of the resin layer 21 is lowered. The resin layer 21 is polished or ground until the vertical wires 12, the metal pillars 16, and the bonding wire 18 are exposed at the upper surface of the resin layer 21. FIG. 2B illustrates the portions of the vertical wires 12, the metal pillars 16, and the bonding wire 18 remaining after the polishing or grinding. The resin layer 21 is polished or ground, for example, using a chemical mechanical polishing (CMP) device or a grinding device. The polishing or the grinding according to the embodiment is performed until the bonding wire 18 is cut, but ends before the controller chip 5 and the metal piece 7 are exposed from the upper surface of the resin layer 21.

In the step of FIG. 2B, an end point of the polishing or grinding of the resin layer 21 is detected using the bonding wire 18. For example, by detecting that the CMP device or the grinding device reaches the bonding wire 18, that the bonding wire 18 is cut by polishing or grinding, or that the state of the bonding wire 18 is changed by the polishing or grinding, the end point of polishing or grinding can be detected. Hereinafter, three examples of the end point detection method using the bonding wire 18 will be described.

In the first example, a motor current flowing in a motor of the CMP device or the grinding device is measured. In the second example, an eddy current flowing in the bonding wire 18 is measured by an eddy current sensor. In the third example, a reflectivity of light on the upper surface of the resin layer 21 is measured by an optical sensor. The values of the motor current, the eddy current, and the reflectivity change due to the influence of polishing or grinding of the bonding wire 18. For example, when the bonding wire 18 is exposed from the upper surface of the resin layer 21, friction characteristics, electric characteristics, and optical characteristics of the upper surface of the resin layer 21 change, which leads to a change in the values of the motor current, the eddy current, and the reflectivity. Accordingly, in the present embodiment, by detecting the change in the motor current, eddy current, or reflectivity, the arrival of the end point of the polishing or grinding of the resin layer 21 can be detected.

In the present embodiment, the second example of end point detection is adopted to detect the end point. That is, the end point of polishing or grinding of the resin layer 21 can be detected by detecting a change in eddy current. In this case, as the size of the bonding wire 18 or the metal piece 7 increases, the value of the eddy current also generally increases. As a result, the end point of polishing or grinding can be detected with higher accuracy. Therefore, it is desirable that the bonding wire 18 or the metal piece 7 according to the embodiment has a size in which a sufficient eddy current is generated. It is also desirable that the bonding wire 18 and the metal piece 7 is formed of a material with which a sufficient eddy current can be generated. By detecting that the value of the eddy current decreases substantially, the end point for polishing or grinding can be detected.

FIGS. 2A and 2B illustrate a plurality of device regions R1 on the substrate 1 and a scribe region R2 on the substrate 1. Each of the device regions R1 has a quadrangular shape in a plan view. The scribe region R2 has a netlike shape in a plan view that surrounds each of the device regions R1. Each of the device regions R1 corresponds to one semiconductor device (e.g., a semiconductor die) illustrated in FIG. 1 and includes one stacked body S.

After the step of FIG. 2B, the metal pads 13, the metal pads 17, and the redistribution layer 22 are placed on the resin layer 21 (refer to FIG. 1). Next, the substrate 1, the resin layer 21, and the redistribution layer 22 are cut along the scribe region R2. As a result, the substrate 1, the resin layer 21, and the redistribution layer 22 are divided into separated device regions R1. Next, in each of the device regions R1, the shield layer 23 is formed on the lower surface of the substrate 1 and on the side surfaces of the substrate 1, the resin layer 21, and the redistribution layer 22. Next, in each of the device regions R1, the metal pads 24 and the metal bumps 25 are formed on the redistribution layer 22. In this way, the semiconductor device according to the embodiment is manufactured.

Figure 3:
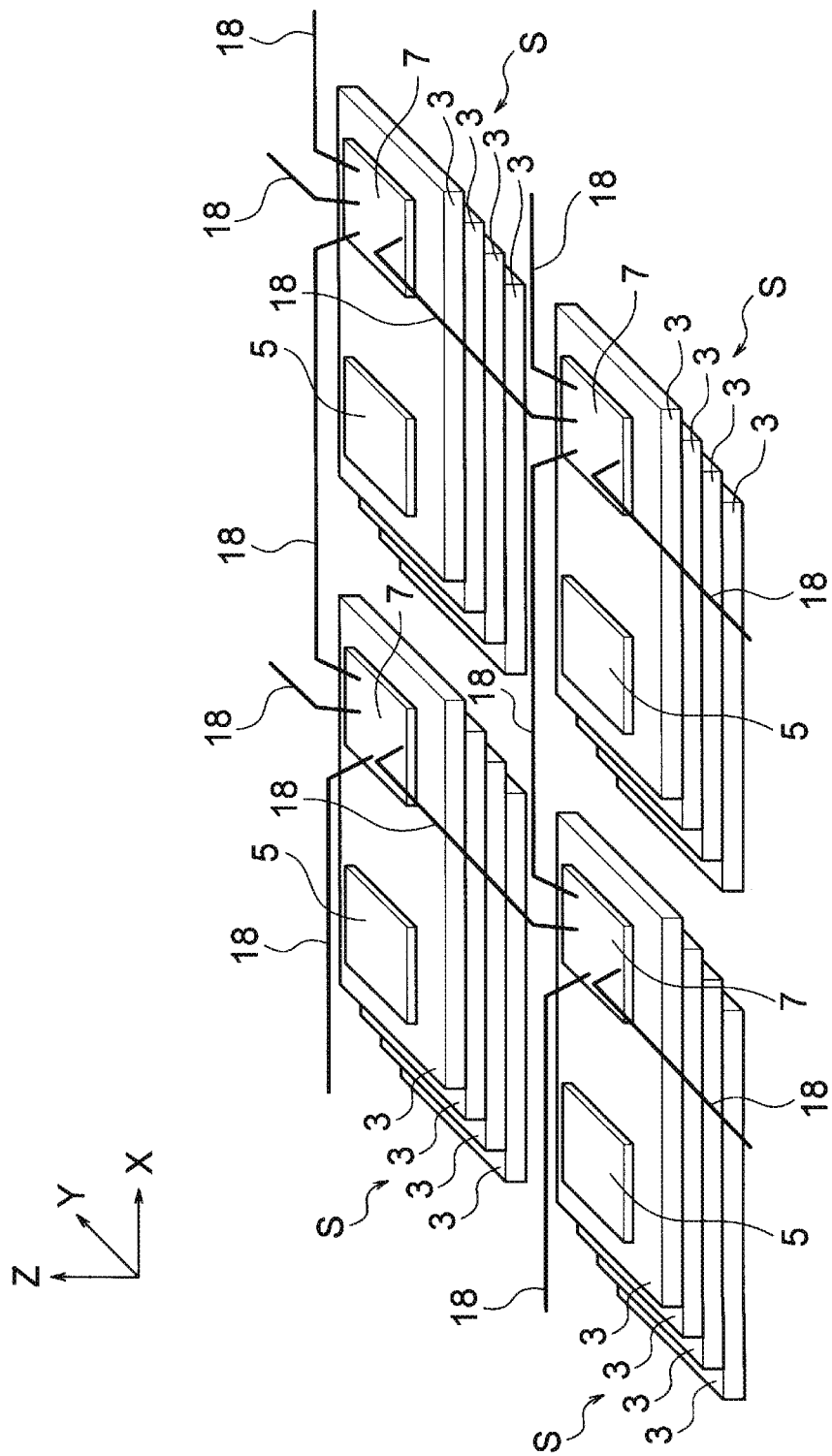
FIG. 3 is a perspective view illustrating aspects related to a method of manufacturing a semiconductor device according to a first embodiment.

FIG. 3 is a perspective view illustrating the method of manufacturing the semiconductor device according to the first embodiment.

FIG. 3 illustrates the plurality of stacked bodies S formed in the step of FIG. 2A. The stacked bodies S are arranged in a shape of a two-dimensional array (quadrangular grid) where the stacked bodies S are adjacent to each other in the X direction and the Y direction. In other words, the stacked bodies S are located at intersections between a plurality of straight lines extending in the X direction and a plurality of straight lines extending in the Y direction.

FIG. 3 further illustrates a plurality of bonding wires 18 formed in the step of FIG. 2A. Each of the bonding wires 18 illustrated in FIG. 3 is located on two metal pieces 7 of two stacked bodies S and connects the stacked bodies S to each other. In addition, each of the bonding wires 18 illustrated in FIG. 3 extends in a direction parallel to the X direction or the Y direction in a plan view. In FIG. 3, four bonding wires 18 are located on each of the metal pieces 7.

In FIG. 3, four metal pieces 7 are electrically connected through four bonding wires 18. Therefore, the metal pieces 7 have the same potential, and an eddy current flows between the metal pieces 7. However, as polishing or grinding progresses in the resin layer 21, the bonding wires 18 are cut, and an eddy current disappears or decreases. As a result, the end point of polishing or grinding can be detected.

Figure 4B:
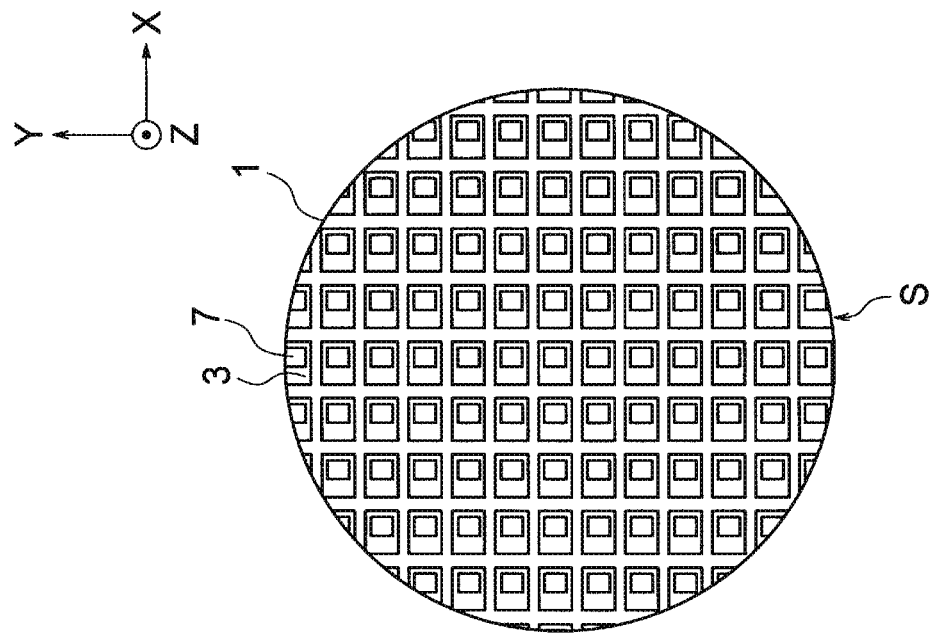
FIGS. 4A and 4B are plan views illustrating aspects related to a method of manufacturing a semiconductor device according to a first embodiment.
Figure 4A:
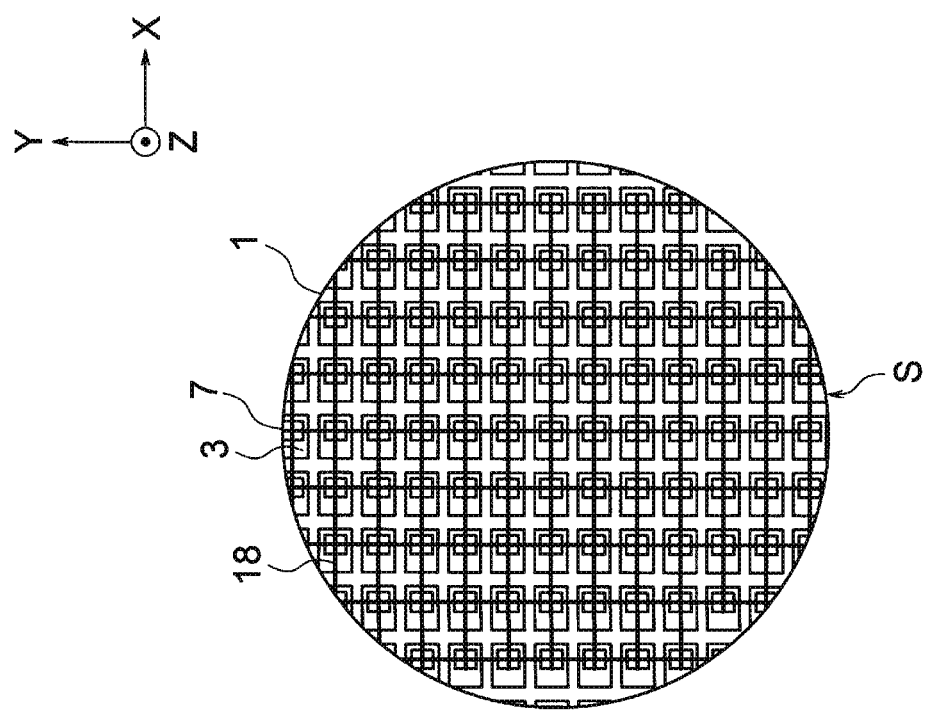

FIGS. 4A and 4B are plan views illustrating the method of manufacturing the semiconductor device according to the first embodiment.

FIG. 4A illustrates the substrate 1 after the bonding wires 18 are located in the step of FIG. 2A. In FIG. 4A, the plurality of stacked bodies S are located on the substrate 1 in a shape of a two-dimensional array, and the plurality of bonding wires 18 are located on the stacked bodies S. Each of the bonding wires 18 extends in a direction parallel to the X direction or the Y direction in a plan view illustrated in FIG. 4A. FIG. 4A illustrates the uppermost memory chip 3 of each of the stacked bodies S and the metal piece 7 of each of the stacked bodies S. The controller chip 5 of each of the stacked bodies S is not illustrated.

FIG. 4B illustrates the substrate 1 after the bonding wires 18 are cut in the step of FIG. 2B. A part of each of the bonding wires 18 remains in each of the metal pieces 7 after being cut in the step of FIG. 2B. However, FIG. 4B does not illustrate the part of each of the bonding wires 18.

FIGS. 5 to 10 are cross-sectional views illustrating the method of manufacturing the semiconductor device according to the first embodiment. Specifically, FIGS. 5 to 10 illustrate the details of the steps of FIGS. 2A and 2B. In addition, FIGS. 5 to 10 illustrate the process of processing one device region R1 among the plurality of device regions R1.

Figure 5:
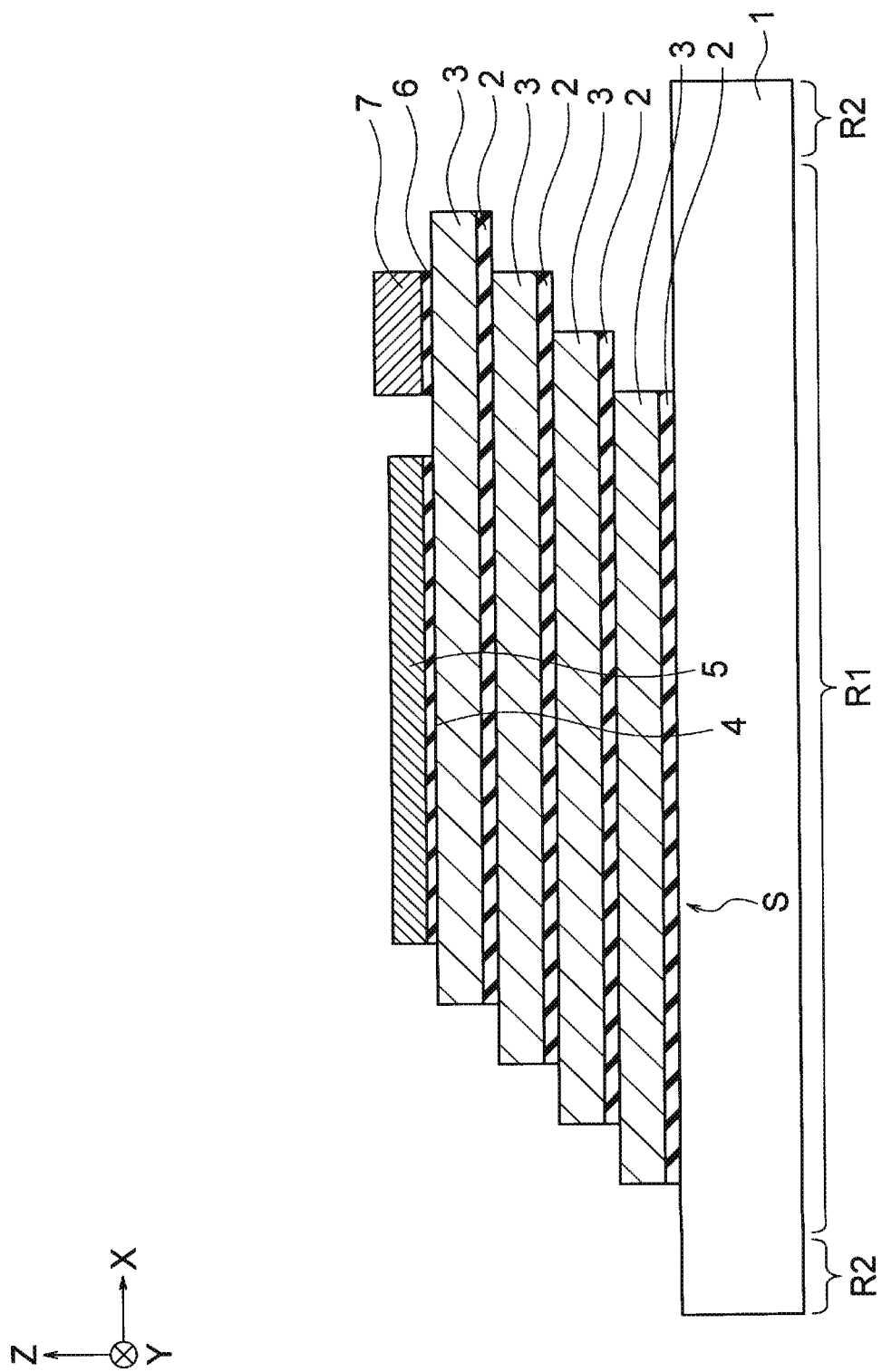
FIGS. 5 to 10 are cross-sectional views illustrating aspects related to manufacturing a semiconductor device according to a first embodiment.

First, the substrate 1 is prepared, and the stacked body S is formed on the substrate 1 (FIG. 5). The stacked body S is formed by stacking a plurality of memory chips 3 on the substrate 1 and stacking the controller chip 5 and the metal piece 7 on the uppermost memory chip 3.

Figure 6:
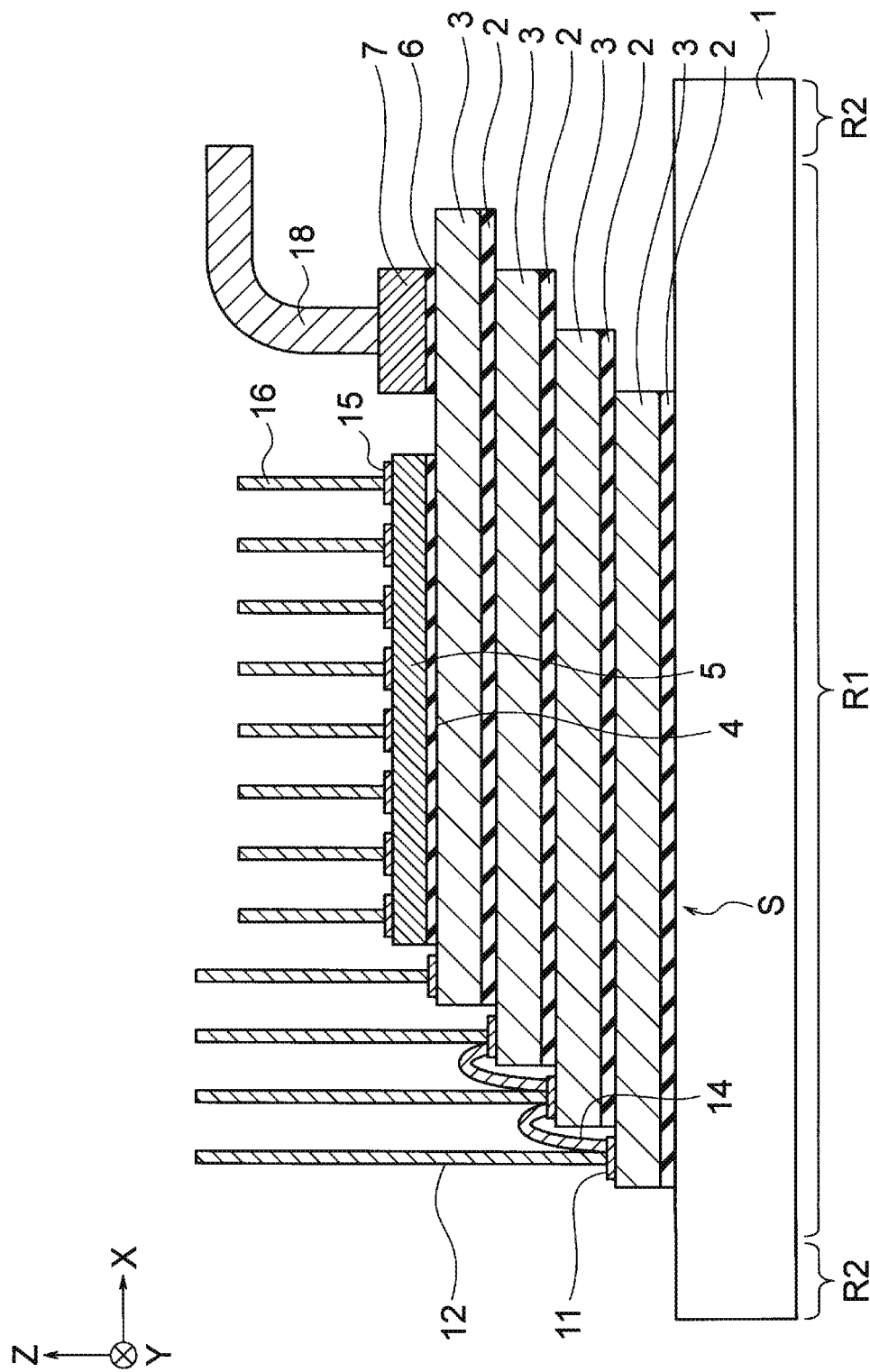

Next, the plurality of metal pads 11, the plurality of vertical wires 12, the plurality of bonding wires 14, the plurality of metal pads 15, the plurality of metal pillars 16, and the bonding wire 18 are located on the stacked body S (FIG. 6). Each of the vertical wires 12 is located on one of the memory chips 3 via a metal pad 11. Each of the bonding wires 14 is connected to two of the metal pads 11 (on separate memory chips 3). Each of the metal pillars 16 is located on the controller chip 5 via a metal pad 11. The bonding wire 18 is connected to the metal piece 7 of the stacked body S illustrated in FIG. 6 and the metal piece 7 of another stacked body S (see, e.g., FIG. 3). As a result, the stacked bodies S are connected to each other through the bonding wire 18.

Figure 7:
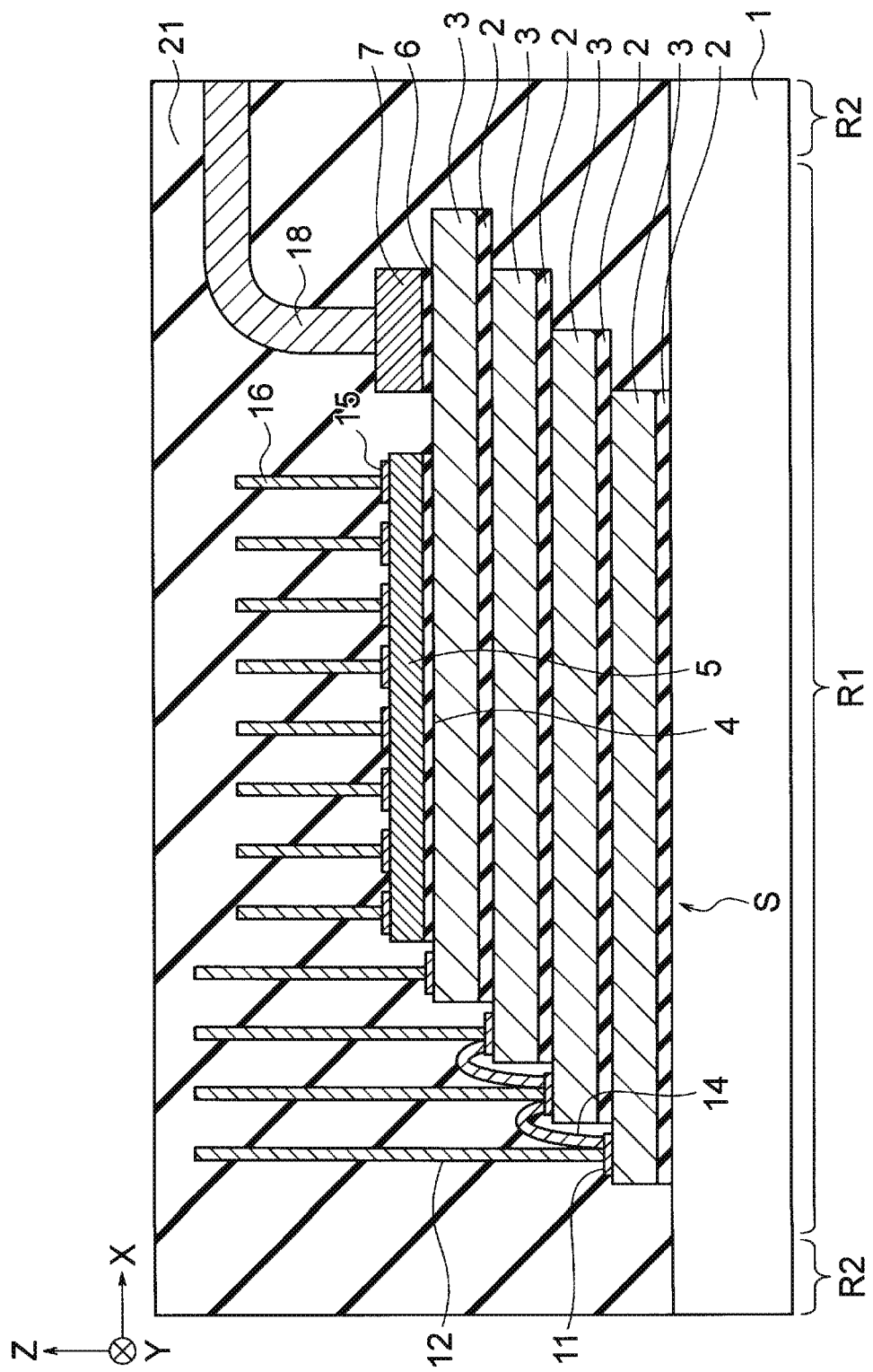

Next, the resin layer 21 is formed on the substrate 1 and the stacked body S (FIG. 7). As a result, the stacked body S is covered with the resin layer 21. Likewise, the metal pads 11, the vertical wires 12, the bonding wires 14, the metal pads 15, the metal pillars 16, and the bonding wire 18 are also covered with the resin layer 21 at this time.

Figure 8:
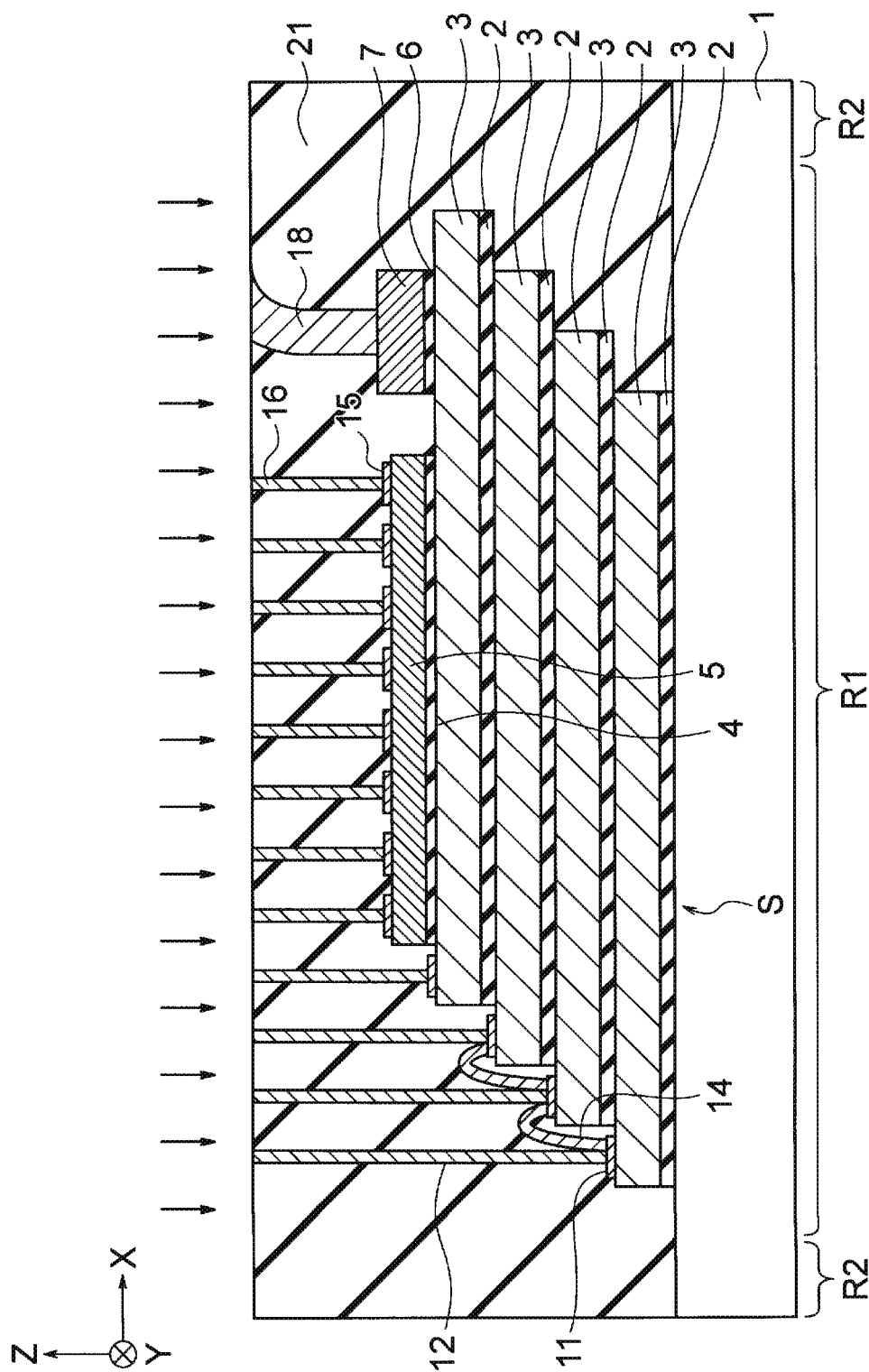

Next, the upper surface of the resin layer 21 is polished or ground (FIG. 8). As a result, the resin layer 21 is gradually removed such that the upper surface of the resin layer 21 is lowered. The resin layer 21 is polished or ground until the vertical wires 12, the metal pillars 16, and the bonding wire 18 are exposed from the upper surface of the resin layer 21. The polishing or the grinding according to the present embodiment is performed until the bonding wire 18 is cut, and ends before the controller chip 5 and the metal piece 7 are exposed from the upper surface of the resin layer 21.

Figure 9:
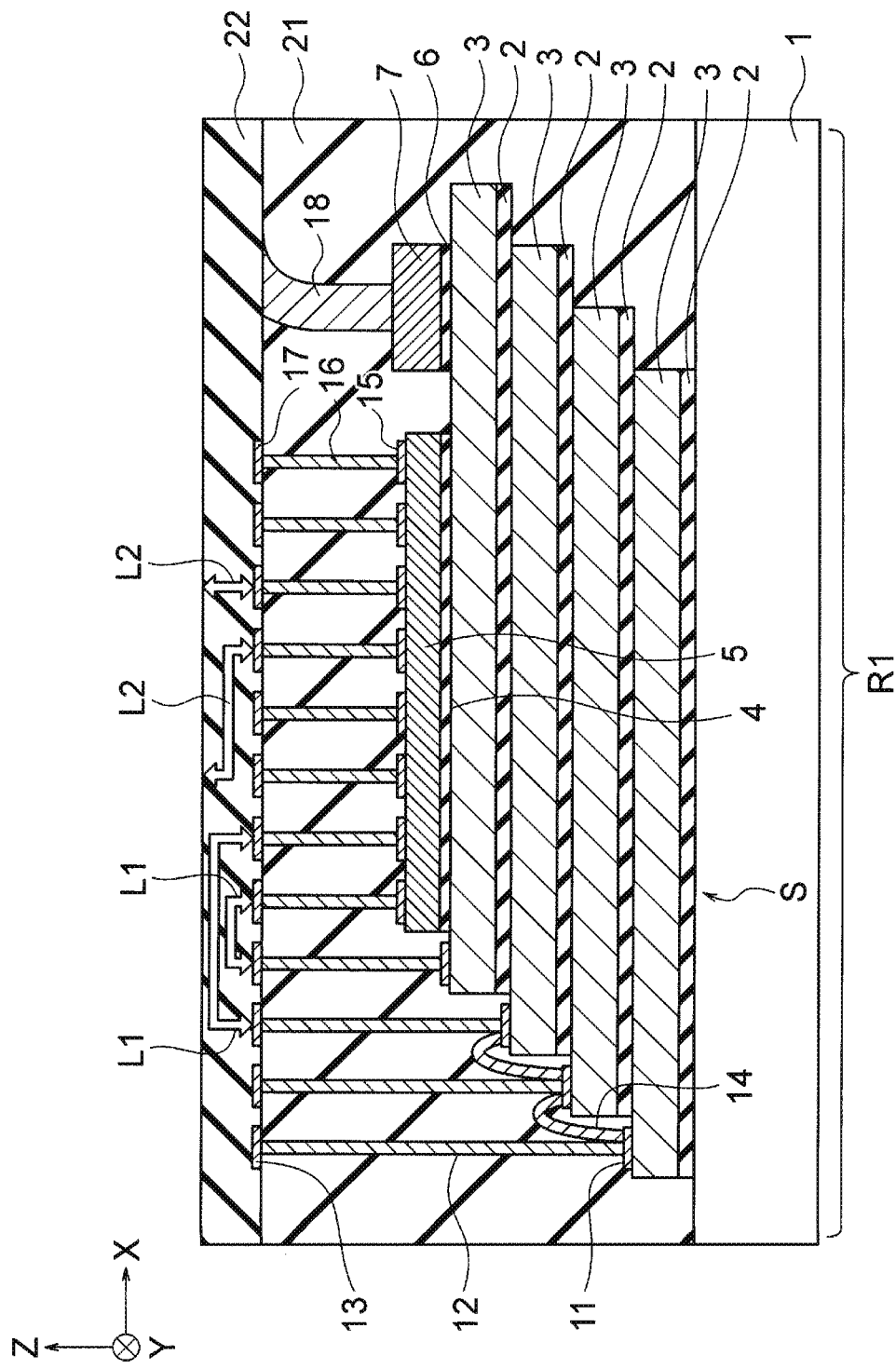

Next, the plurality of metal pads 13, the plurality of metal pads 17, and the redistribution layer 22 are placed on the resin layer 21 (FIG. 9). As a result, the vertical wires 12 and the metal pillars 16 are electrically connected to each other through the wirings L1.

Next, the substrate 1, the resin layer 21, and the redistribution layer 22 are cut along the scribe region R2 (FIG. 9). As a result, the substrate 1, the resin layer 21, and the redistribution layer 22 are divided into individual (separate) device regions R1.

Figure 10:
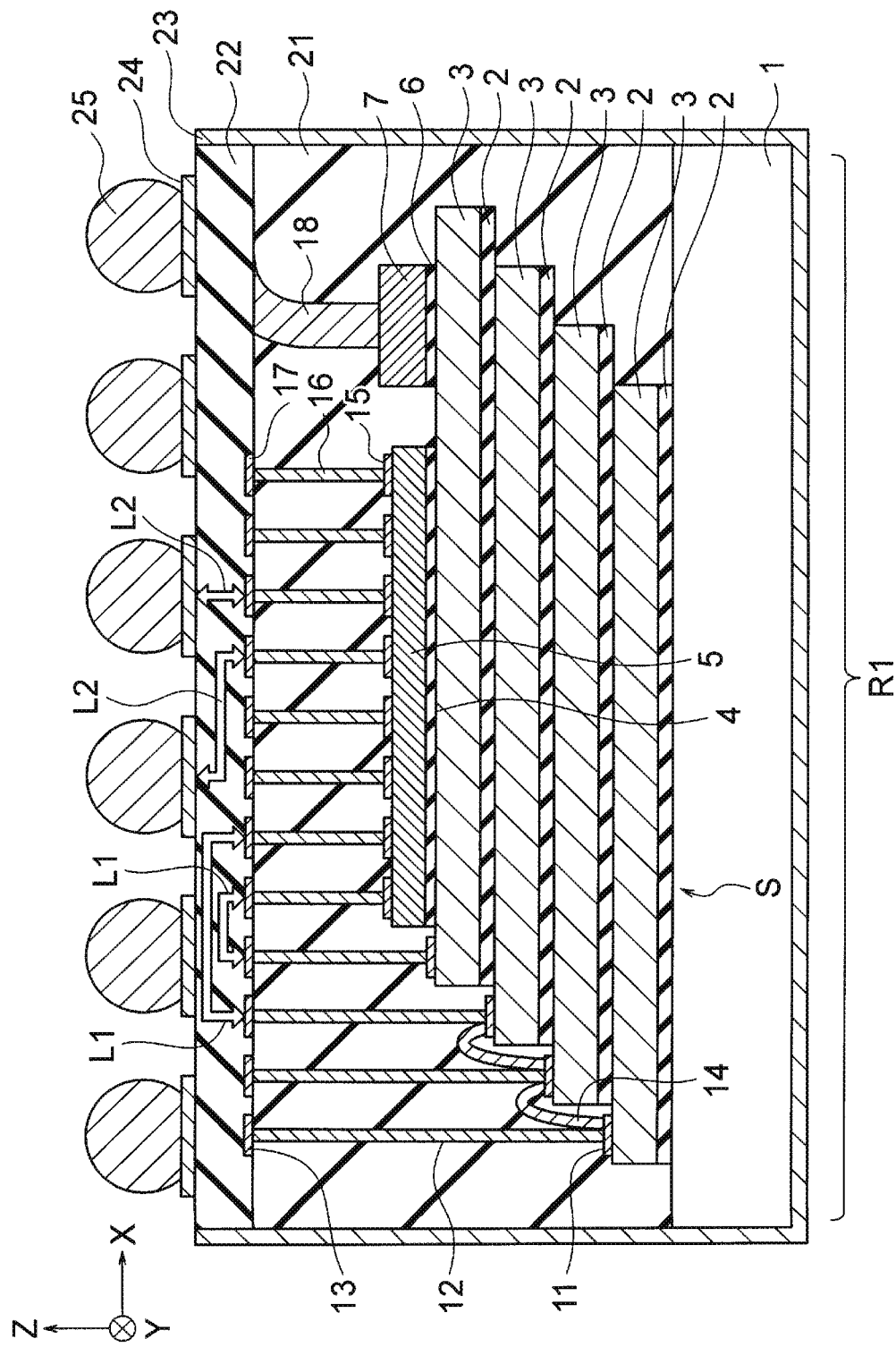

Next, on each of these separated device regions R1, the shield layer 23 is formed on the lower surface of the substrate 1 and on the side surfaces of the substrate 1, the resin layer 21, and the redistribution layer 22 (FIG. 10). Next, in each of the device regions R1, the plurality of metal pads 24 and the plurality of metal bumps 25 are formed on the redistribution layer 22 (FIG. 10). As a result, the metal pillars 16 and the metal bumps 25 are electrically connected to each other through the wirings L2. The bonding wire 18 according to the present embodiment is not electrically connected to the wirings in the redistribution layer 22 and is electrically insulated from the wirings in the redistribution layer 22. In this way, the semiconductor device according to the present embodiment is manufactured.

As described above, when the semiconductor device according to the embodiment is manufactured, a plurality of stacked bodies S are formed on the substrate 1, and a plurality of bonding wires 18 that connect the stacked bodies S to each other are located on the stacked bodies S. Furthermore, the resin layer 21 is formed on the stacked bodies S and the bonding wires 18, and then subsequently the upper surface of the resin layer 21 is polished or ground. Accordingly, the resin layer can be appropriately formed by, for example, using the bonding wire 18 to detect the end point of polishing or grinding. Thus, the polished resin layer 21 can be a desired thickness.

Each of the memory chips 3 may include any type of memory cell array. For example, each of the memory chips 3 may include a memory cell array of a NAND memory type or may include a memory cell array of a DRAM type. In addition, each of the stacked bodies S may include a semiconductor chip other than a memory chip 3 or may include a semiconductor chip other than the controller chip 5. In addition, the semiconductor device according to the embodiment may include a wire other than the bonding wire 18 on the metal piece 7, or may include a wire other than the vertical wire 12 on the metal pad 11. The same can also be applied to second to sixth embodiments described below.

Second Embodiment

Figure 11:
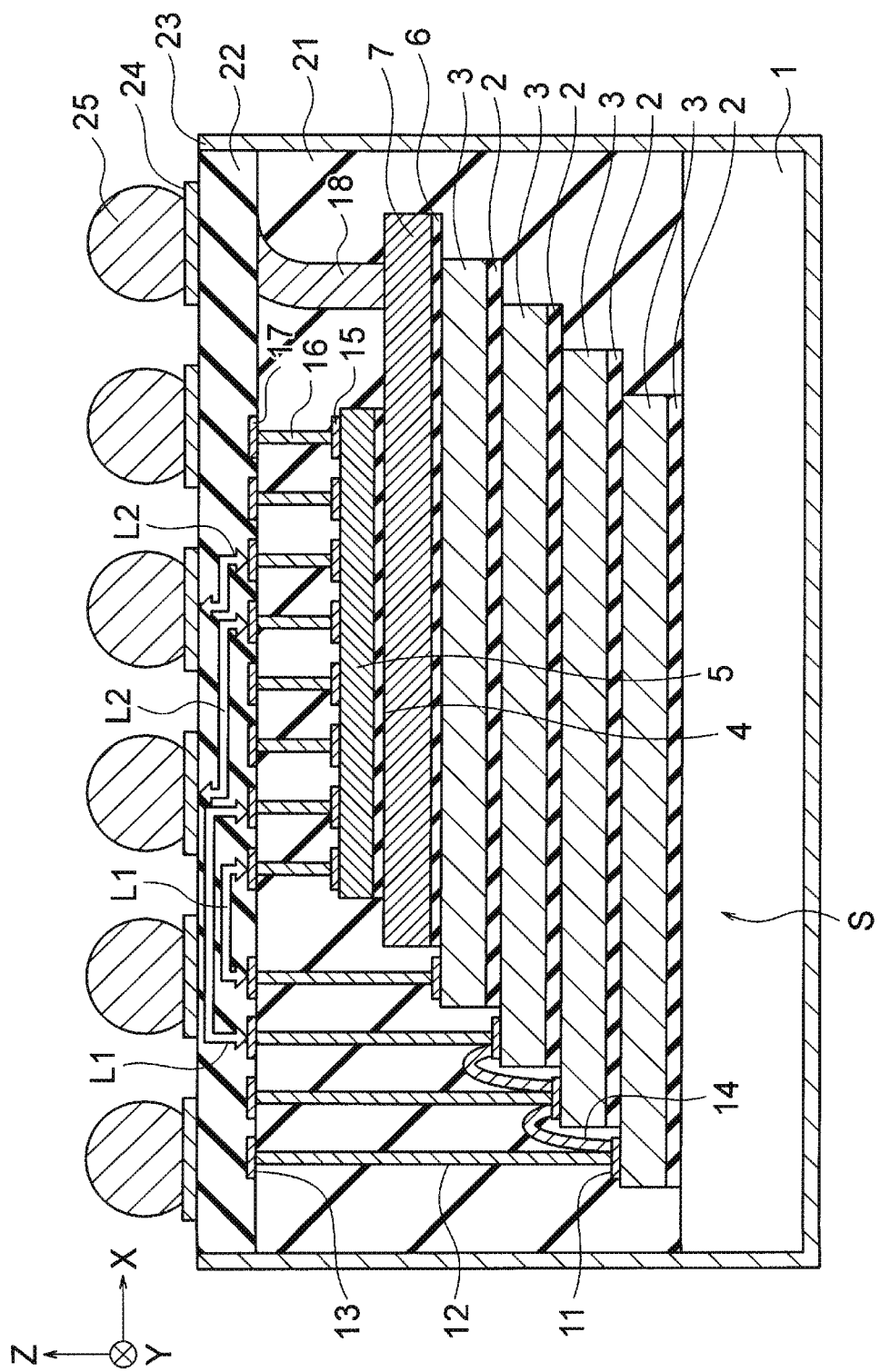
FIG. 11 is a cross-sectional view of a semiconductor device according to a second embodiment.

FIG. 11 is a cross-sectional view illustrating a structure of a semiconductor device according to a second embodiment.

The semiconductor device according to the second embodiment illustrated in FIG. 11 includes generally the same components as the semiconductor device according to the first embodiment illustrated in FIG. 1. However, the metal piece 7 according to the second embodiment has a planar area that matches (or substantially so) the planar area of each of the memory chips 3. In the stacked body S according to the second embodiment, the metal piece 7 is stacked on the uppermost memory chip 3, and then the controller chip 5 is stacked on the metal piece 7.

By increasing the size of the metal piece 7, a high eddy current can be generated. On the other hand, the total height of the stacked body S may be increased relative to that of the first embodiment since the thickness of the metal piece 7 and the controller chip 5 are cumulative in the second embodiment.

Figure 12:
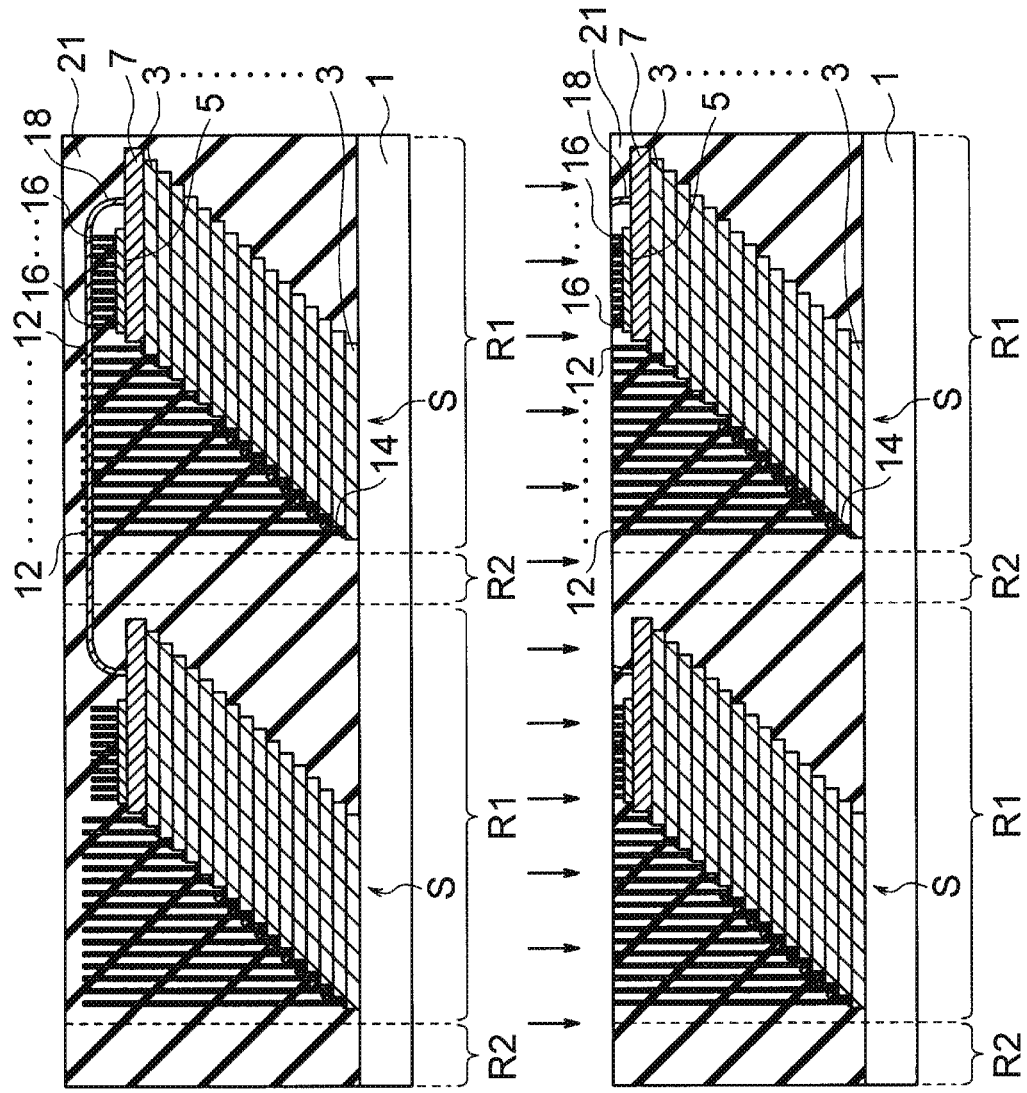
FIGS. 12A and 12B are cross-sectional views illustrating aspects related to a method of manufacturing the semiconductor device according to a second embodiment.

FIGS. 12A and 12B are cross-sectional views illustrating a method of manufacturing the semiconductor device according to the second embodiment.

First, the substrate 1 is prepared, and a plurality of stacked bodies S are formed on the substrate 1 (FIG. 12A). Each of the stacked bodies S is formed by stacking a plurality of memory chips 3 on the substrate 1, stacking the metal piece 7 on the uppermost memory chip 3, and then stacking the controller chip 5 on the metal piece 7. FIG. 12A illustrates just two stacked bodies S among the plurality of stacked bodies S.

The plurality of metal pads 11, the plurality of vertical wires 12, the plurality of bonding wires 14, the plurality of metal pads 15, the plurality of metal pillars 16, and the plurality of bonding wires 18 are formed on the stacked bodies S (FIG. 12A). FIG. 12A does not separately illustrate the metal pads 11 and 15. In addition, FIG. 12A illustrates just one bonding wire 18 among the plurality of bonding wires 18.

Next, the resin layer 21 is formed on the substrate 1 and the stacked bodies S (FIG. 12A). As a result, the stacked bodies S are covered with the resin layer 21.

Next, the upper surface of the resin layer 21 is polished or ground (FIG. 12B). In this process, the resin layer 21 is gradually removed from the upper surface such that thickness of the resin layer 21 is reduced. As in the first embodiment, the end point of polishing or grinding is detected using the bonding wire 18.

After FIG. 12B, the metal pads 13, the metal pads 17, and the redistribution layer 22 are formed on the resin layer 21 (refer to FIG. 11). Next, the substrate 1, the resin layer 21, and the redistribution layer 22 are cut along the scribe region R2. As a result, the substrate 1, the resin layer 21, and the redistribution layer 22 are divided into separate device regions R1. Next, on each of the device regions R1, the shield layer 23 is formed on the lower surface of the substrate 1 and on the side surfaces of the substrate 1, the resin layer 21, and the redistribution layer 22. Next, the metal pads 24 and the metal bumps 25 are formed on the redistribution layer 22. In this way, the semiconductor device according to the second embodiment is manufactured.

Figure 13:
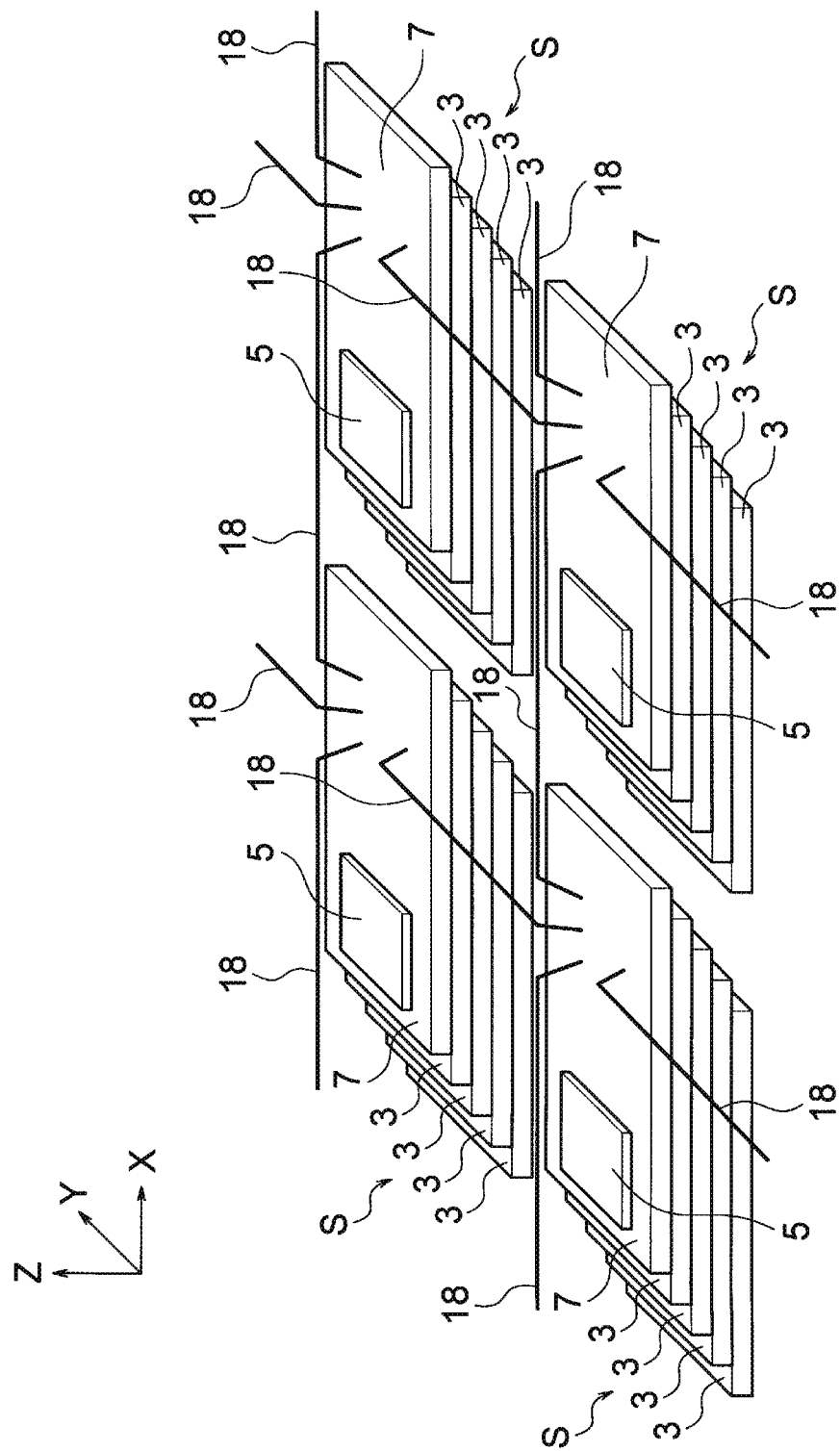
FIG. 13 is a perspective view illustrating aspects related to a method of manufacturing a semiconductor device according to a second embodiment.

FIG. 13 is a perspective view illustrating the method of manufacturing the semiconductor device according to the second embodiment.

FIG. 13 illustrates the plurality of stacked bodies S and the plurality of bonding wires 18 formed in the step of FIG. 12A. Each of the bonding wires 18 illustrated in FIG. 13 is connected to two metal pieces 7 on two different stacked bodies S and thus connects the stacked bodies S to each other. The metal piece 7 according to the second embodiment is between the uppermost memory chip 3 and the controller chip 5.

FIGS. 14 to 18 are cross-sectional views illustrating the method of manufacturing the semiconductor device according to the second embodiment. Specifically, FIGS. 14 to 18 illustrate certain details of the steps depicted in FIGS. 12A and 12B. In addition, FIGS. 14 to 18 illustrate the singulation processing of a device region R1 from among the plurality of device regions R1.

Figure 14:
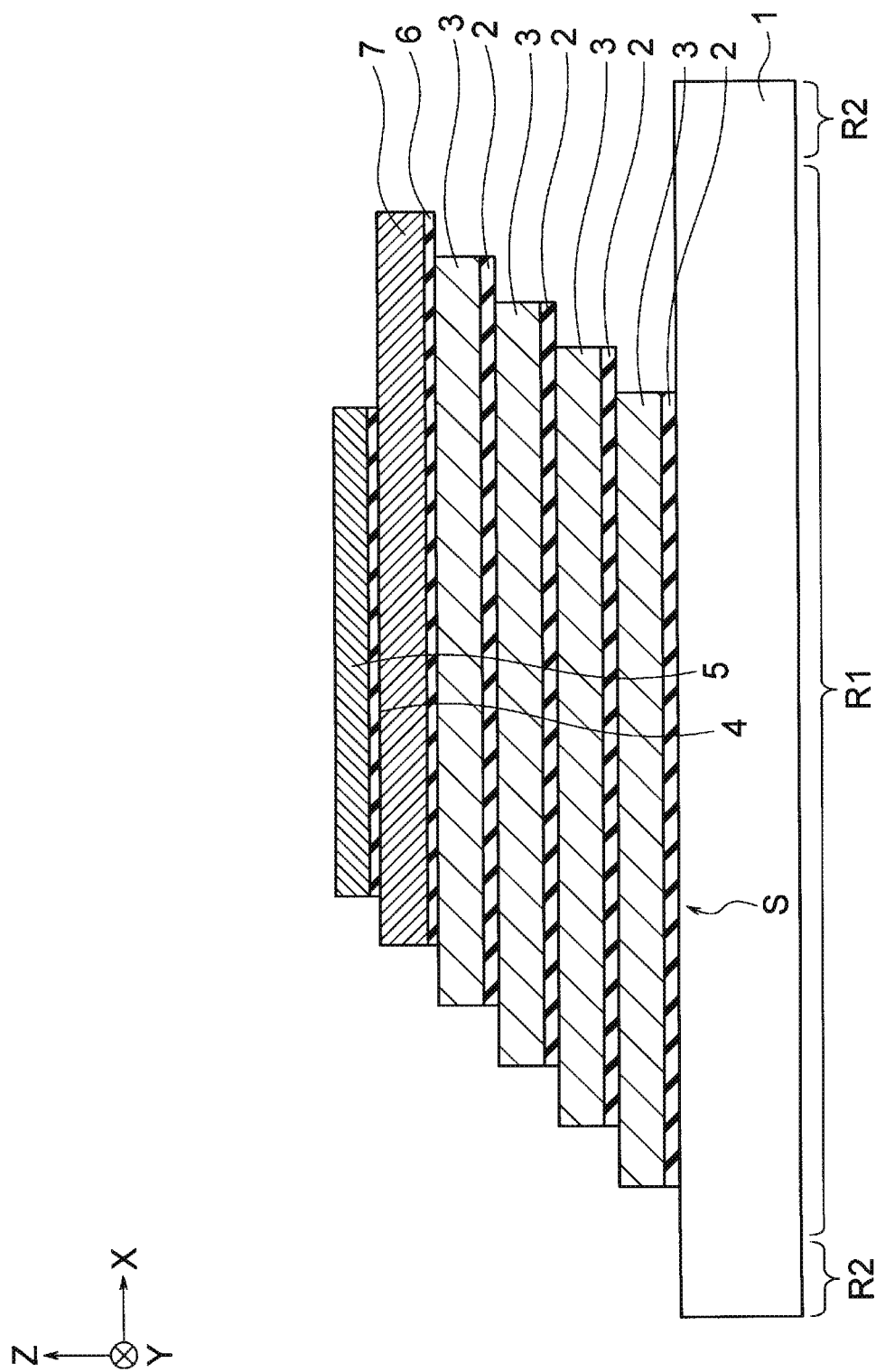
FIGS. 14 to 18 are cross-sectional views illustrating aspects related to a method of manufacturing a semiconductor device according to a second embodiment.

First, the substrate 1 is prepared, and the stacked body S is formed on the substrate 1 (FIG. 14). The stacked body S is formed by stacking a plurality of memory chips 3 on the substrate 1, stacking the metal piece 7 on the uppermost memory chip 3, and then stacking the controller chip 5 on the metal piece 7.

Figure 15:
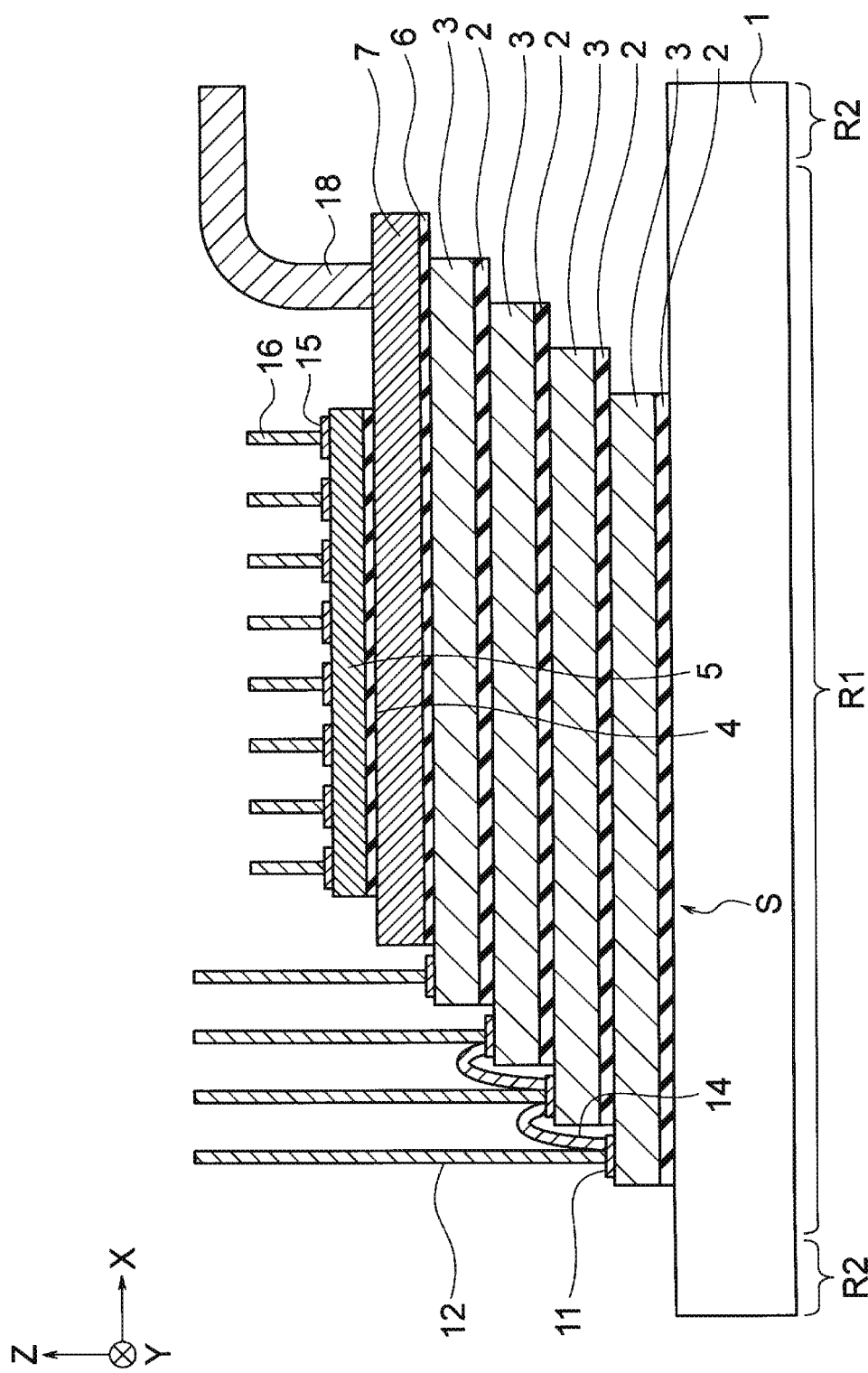
Figure 16:
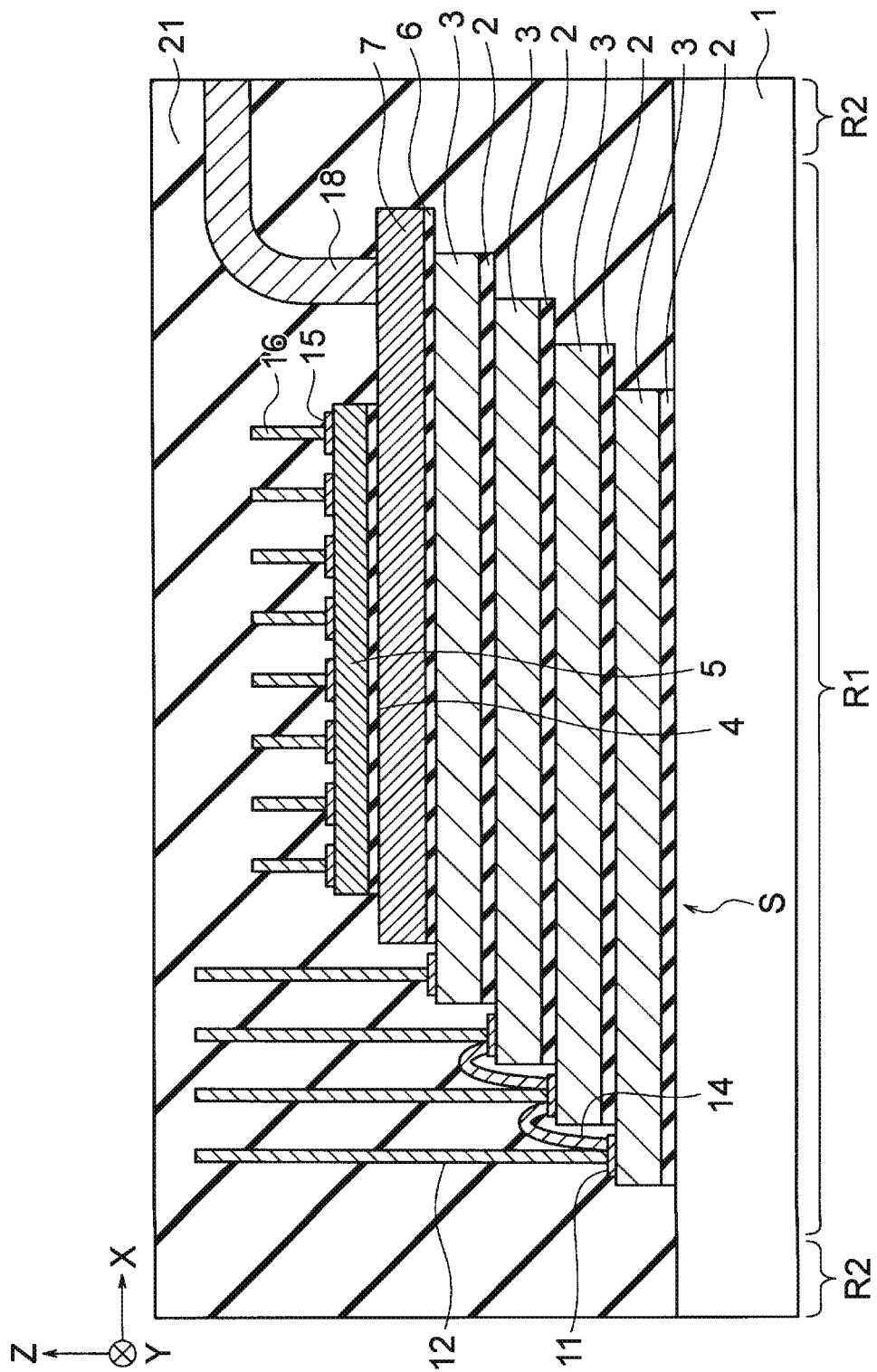
Figure 17:
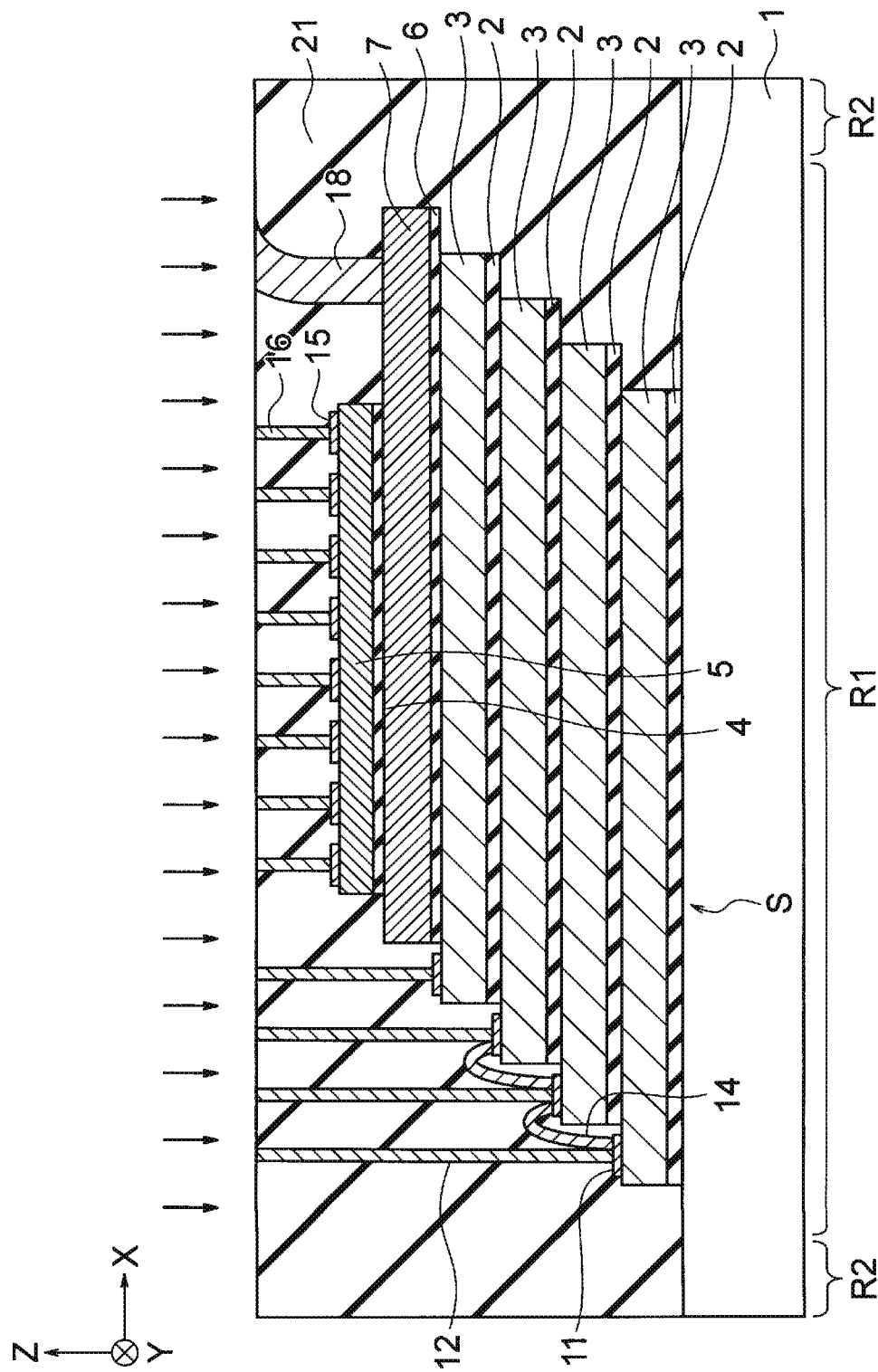

Next, the plurality of metal pads 11, the plurality of vertical wires 12, the plurality of bonding wires 14, the plurality of metal pads 15, the plurality of metal pillars 16, and the bonding wire 18 are formed on the stacked body S (FIG. 15). Next, the resin layer 21 is formed on the substrate 1 and the stacked body S (FIG. 16). Next, the upper surface of the resin layer 21 is polished or ground (FIG. 17).

Figure 18:
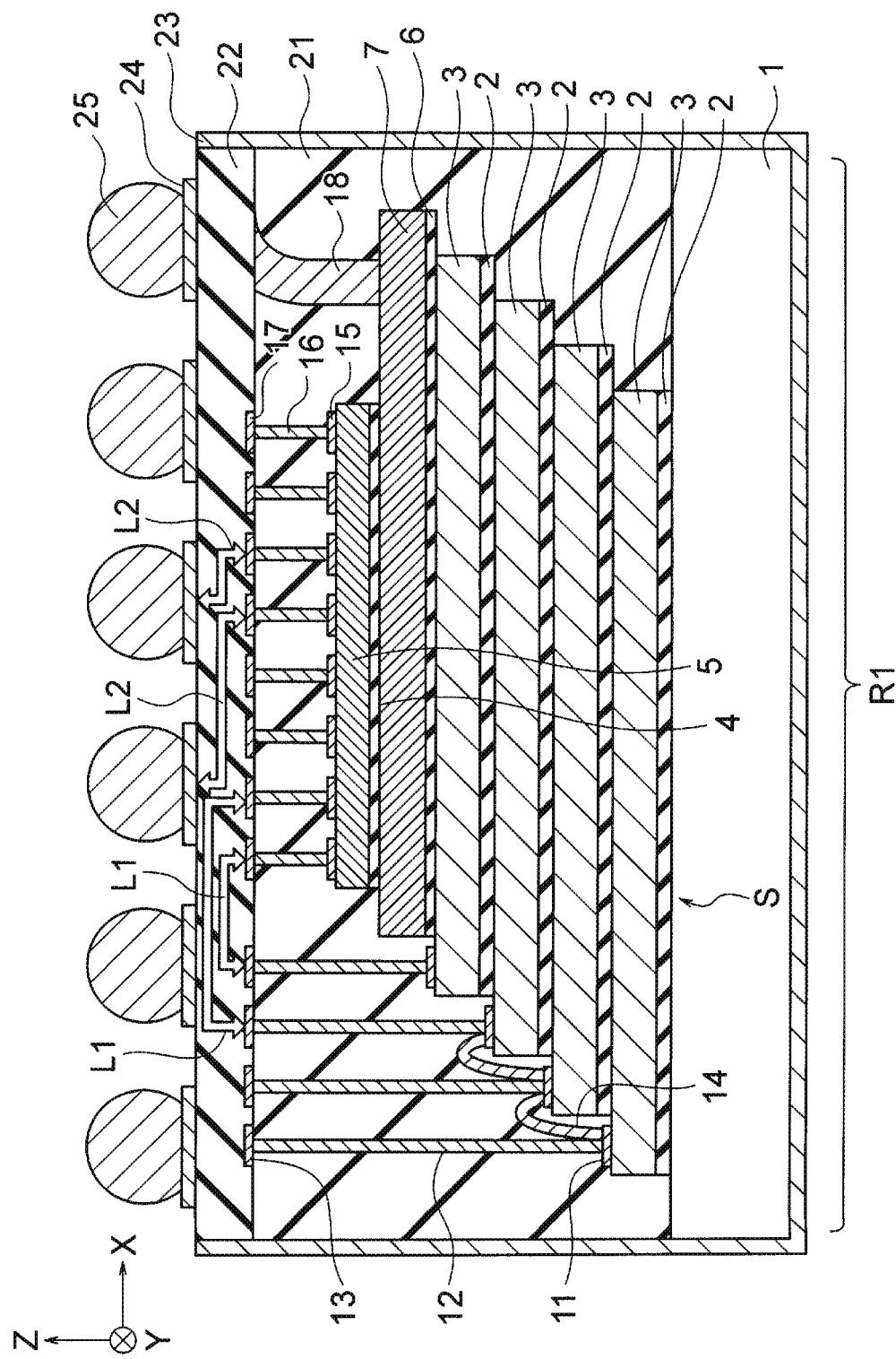

Next, the plurality of metal pads 13, the plurality of metal pads 17, and the redistribution layer 22 are formed on the resin layer 21 (FIG. 18). Next, the substrate 1, the resin layer 21, and the redistribution layer 22 are cut along the scribe region R2 (FIG. 18). Next, on each of the device regions R1, the shield layer 23 is formed on the lower surface of the substrate 1 and on the side surfaces of the substrate 1, the resin layer 21, and the redistribution layer 22 (FIG. 18). Next, in each of the device regions R1, the plurality of metal pads and the plurality of metal bumps 25 are formed on the redistribution layer 22 (FIG. 18). In this way, the semiconductor device according to the second embodiment is manufactured.

Figure 19:
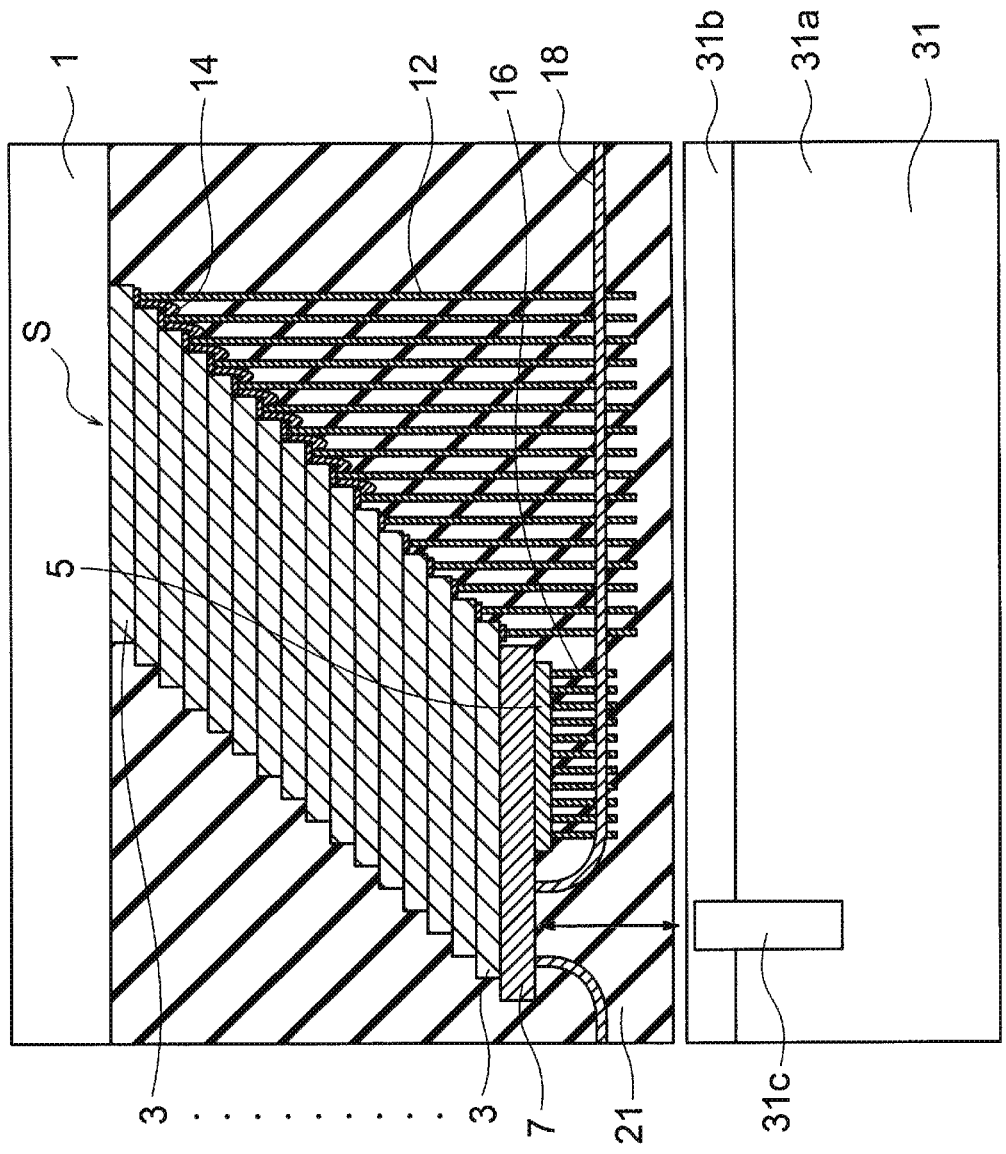
FIG. 19 is a cross-sectional view illustrating a first example of an end point detection method according to a second embodiment.

FIG. 19 is a cross-sectional view illustrating a first example of an end point detection method according to the second embodiment.

FIG. 19 illustrates a step of polishing the upper surface of the resin layer 21 using a CMP device 31. When the upper surface of the resin layer 21 is being polished using the CMP device 31, the upper surface of the resin layer 21 is directed downward such that the upper surface of the resin layer 21 comes into contact with the CMP device 31. Therefore, the upper surface of the resin layer 21 illustrated in FIG. 19 is facing in the −Z direction.

In FIG. 19, the CMP device 31 includes a polishing table 31a, a polishing pad 31b, and a sensor 31c. The polishing pad 31b is mounted on the polishing table 31a and is rotated by the polishing table 31a. In the CMP device 31, the upper surface of the resin layer 21 can be polished by pressing the upper surface of the resin layer 21 against an upper surface of the polishing pad 31b that is rotating.

The sensor 31c is inserted into a hole disposed in the polishing table 31a and the polishing pad 31b. The sensor 31c is, for example, a distance sensor using an eddy current for measuring/calculating a distance. In FIG. 19, the distance between the sensor 31c and the metal piece 7 is indicated by an arrow. In this case, in the CMP device 31, by measuring an eddy current flowing in the bonding wire 18 with the sensor 31c, the distance can be measured and an end point of polishing of the resin layer 21 can be detected based on the measured distance. The first method illustrated in FIG. 19 is applicable to any of the embodiments.

Figure 20:
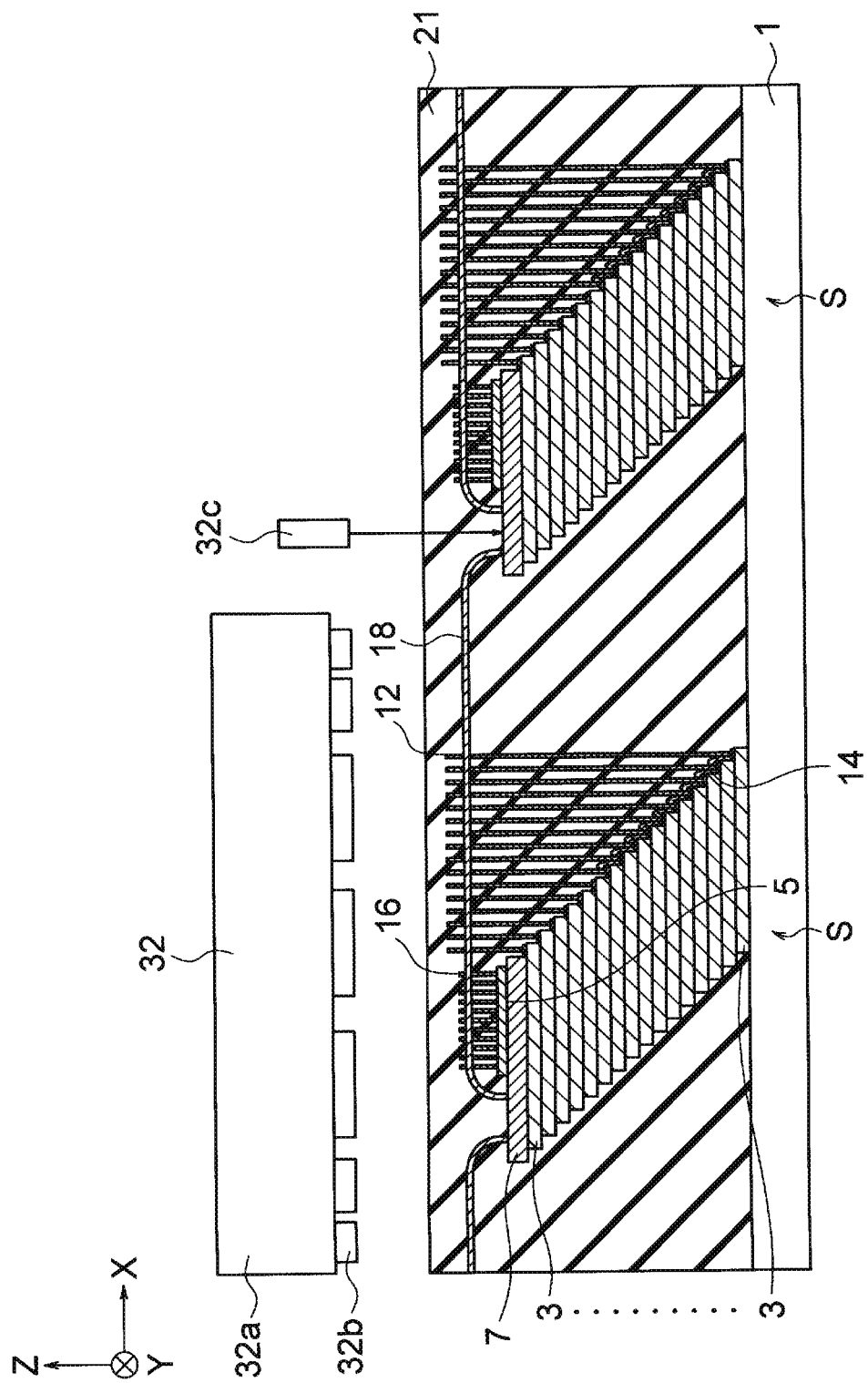
FIG. 20 is a cross-sectional view illustrating a second example of an end point detection method according to a second embodiment.

FIG. 20 is a cross-sectional view illustrating a second example of an end point detection method according to the second embodiment.

FIG. 20 illustrates a step of grinding the upper surface of the resin layer 21 using a grinding device 32. When the upper surface of the resin layer 21 is ground using the grinding device 32, the upper surface of the resin layer 21 is brought into contact with the grinding device 32 while the upper surface of the resin layer 21 is directed upward. Therefore, the upper surface of the resin layer 21 illustrated in FIG. 20 is facing in the +Z direction.

In FIG. 20, the grinding device 32 includes a wheel 32a, a plurality of protrusions 32b, and a sensor 32c. The protrusions 32b are disposed on an outer surface of the wheel 32a and rotate together with the wheel 32a. In the grinding device 32, the upper surface of the resin layer 21 can be ground by pressing the protrusions 32b against the upper surface of the resin layer 21.

The sensor 32c is disposed at a position away from the wheel 32a. The sensor 32c is, for example, a distance sensor using an eddy current. In FIG. 20, the distance between the sensor 32c and the metal piece 7 is indicated by an arrow. In this case, by measuring an eddy current flowing in the bonding wire 18 with the sensor 32c, the distance can be measured and an end point of polishing of the resin layer 21 can be detected. The second method illustrated in FIG. 20 is applicable any of the disclosed embodiments.

As described above, when the semiconductor device according to an embodiment is manufactured, a plurality of stacked bodies S are formed on the substrate 1, and a plurality of bonding wires 18 that connect the stacked bodies S to each other are formed. Further, the resin layer 21 is formed on the stacked bodies S and the bonding wires 18, and subsequently the upper surface of the resin layer 21 is polished or ground. Accordingly, the resin layer 21 can be appropriately formed by using the bonding wire 18 to detect the end point of polishing or grinding.

Third Embodiment

Figure 21:
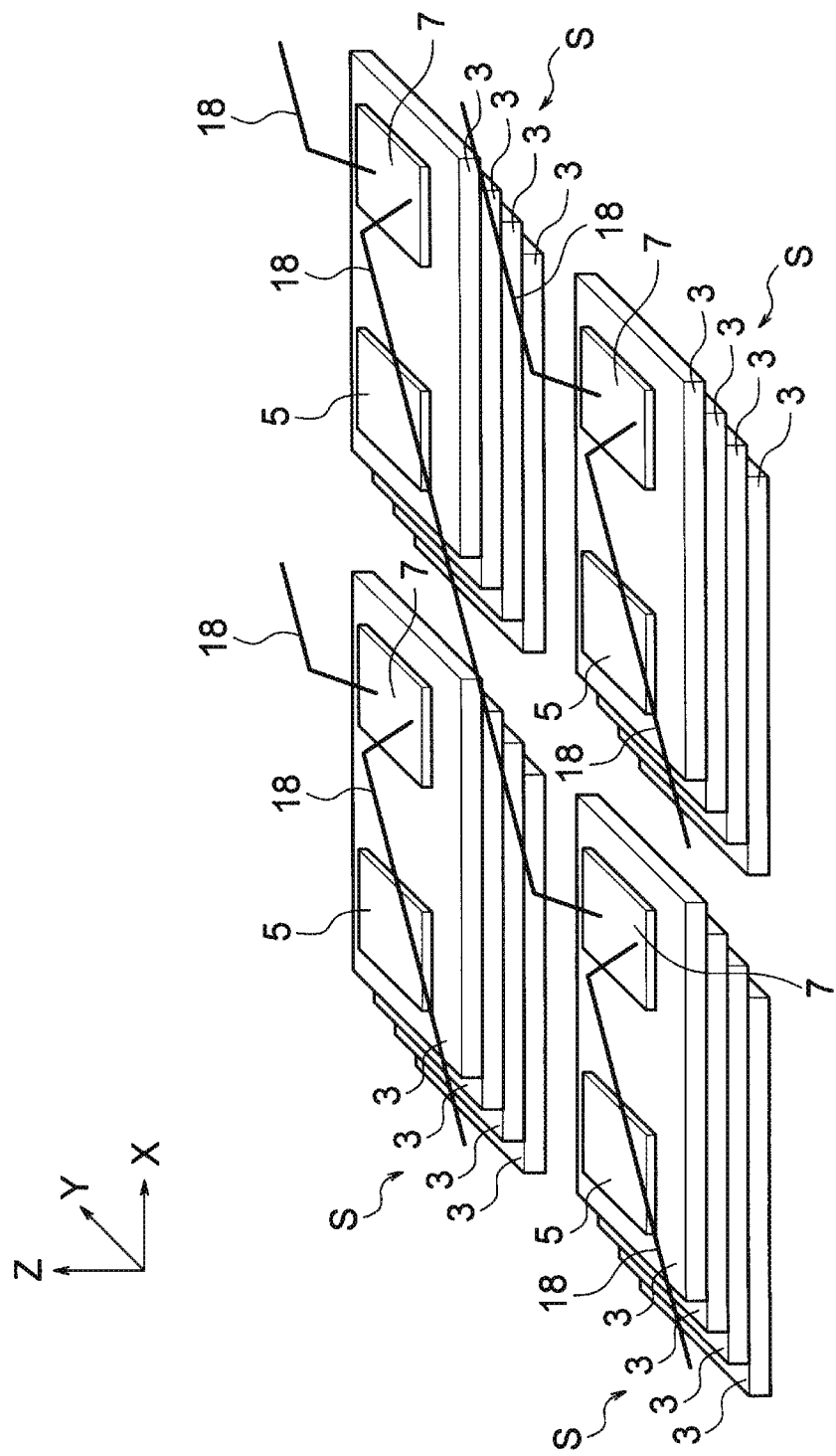
FIG. 21 is a perspective view illustrating aspects related to a method of manufacturing a semiconductor device according to a third embodiment.

FIG. 21 is a perspective view illustrating the method of manufacturing a semiconductor device according to a third embodiment.

FIG. 21 illustrates a plurality of stacked bodies S and a plurality of bonding wires 18 formed in the step of FIG. 2A. FIG. 21 corresponds in general to FIG. 3 related to the first embodiment. The stacked bodies S are arranged in a shape of a two-dimensional array (quadrangular grid) in which the stacked bodies S are adjacent to each other in the X direction and the Y direction. The bonding wires 18 illustrated in FIG. 21 are connected to two different metal pieces 7 on two different stacked bodies S and connect these stacked bodies S to each other. However, in plan view, the bonding wires 18 illustrated in FIG. 21 extends in a direction that is not parallel to the X direction or the Y direction. In the third embodiment, an eddy current may be more likely to flow in the bonding wires 18.

Figure 22B:
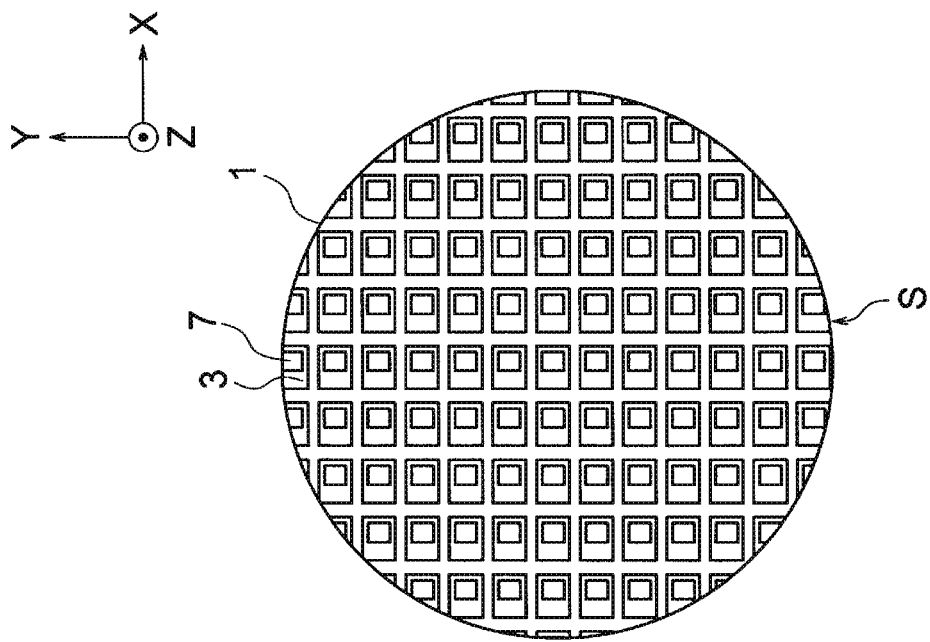
FIGS. 22A and 22B are plan views illustrating aspects related to a method of manufacturing a semiconductor device according to a third embodiment.
Figure 22A:
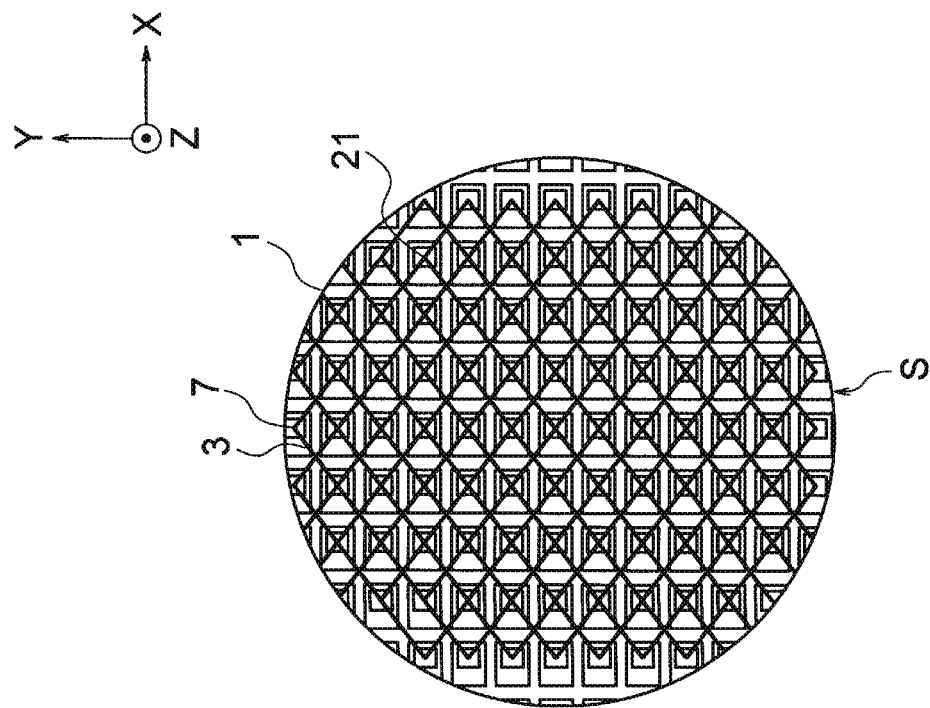

FIGS. 22A and 22B are plan views illustrating the method of manufacturing the semiconductor device according to the third embodiment.

FIG. 22A illustrates the substrate 1 after the bonding wires 18 are formed in the step of FIG. 2A. FIG. 22A corresponds in general to FIG. 4A for the first embodiment. In plan view, as illustrated in FIG. 22A, the bonding wires 18 extend in a direction that is not parallel to the X direction or the Y direction.

FIG. 22B illustrates the substrate 1 after the bonding wires 18 are cut in the step of FIG. 2B. FIG. 22B corresponds in general to FIG. 4B for the first embodiment. A part of each of the bonding wires 18 remains on the metal pieces 7 after being cut in the step of FIG. 2B. However, FIG. 22B does not specifically illustrate the remaining part of each of the bonding wires 18.

In the third embodiment, the resin layer 21 can be appropriately formed as in the first and second embodiments by using the bonding wire 18 to detect the end point of polishing or grinding.

Fourth Embodiment

Figure 23:
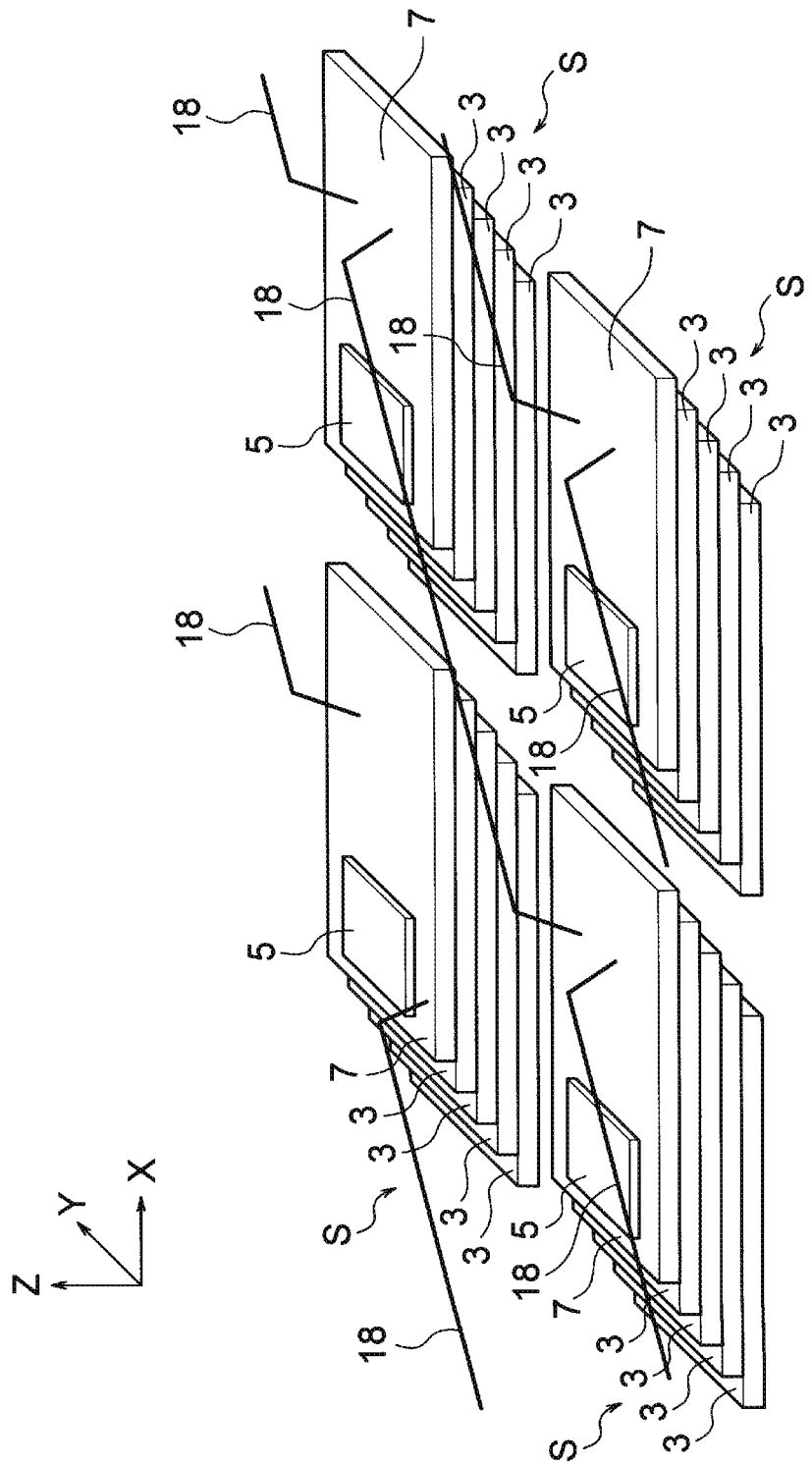
FIG. 23 is a perspective view illustrating aspects related to a method of manufacturing a semiconductor device according to a fourth embodiment.

FIG. 23 is a perspective view illustrating a method of manufacturing a semiconductor device according to a fourth embodiment.

FIG. 23 illustrates a plurality of stacked bodies S and a plurality of bonding wires 18 formed in the step of FIG. 12A. FIG. 23 corresponds in general to FIG. 13 for the second embodiment. The stacked bodies S are arranged in a shape of a two-dimensional array (quadrangular grid) where the stacked bodies S are adjacent to each other in the X direction and the Y direction. In addition, the bonding wires 18 illustrated in FIG. 23 are connected to two different metal pieces 7 of two different stacked bodies S and connect these stacked bodies S to each other. However, in plan view, the bonding wires 18 illustrated in FIG. 23 extends in a direction that is not parallel to the X direction or the Y direction. In the fourth embodiment, an eddy current may be more likely to flow in the bonding wires 18.

In the fourth embodiment, the resin layer 21 can be appropriately formed as in the first to third embodiments by using the bonding wire 18 to detect the end point of polishing or grinding.

Fifth Embodiment

Figure 24:
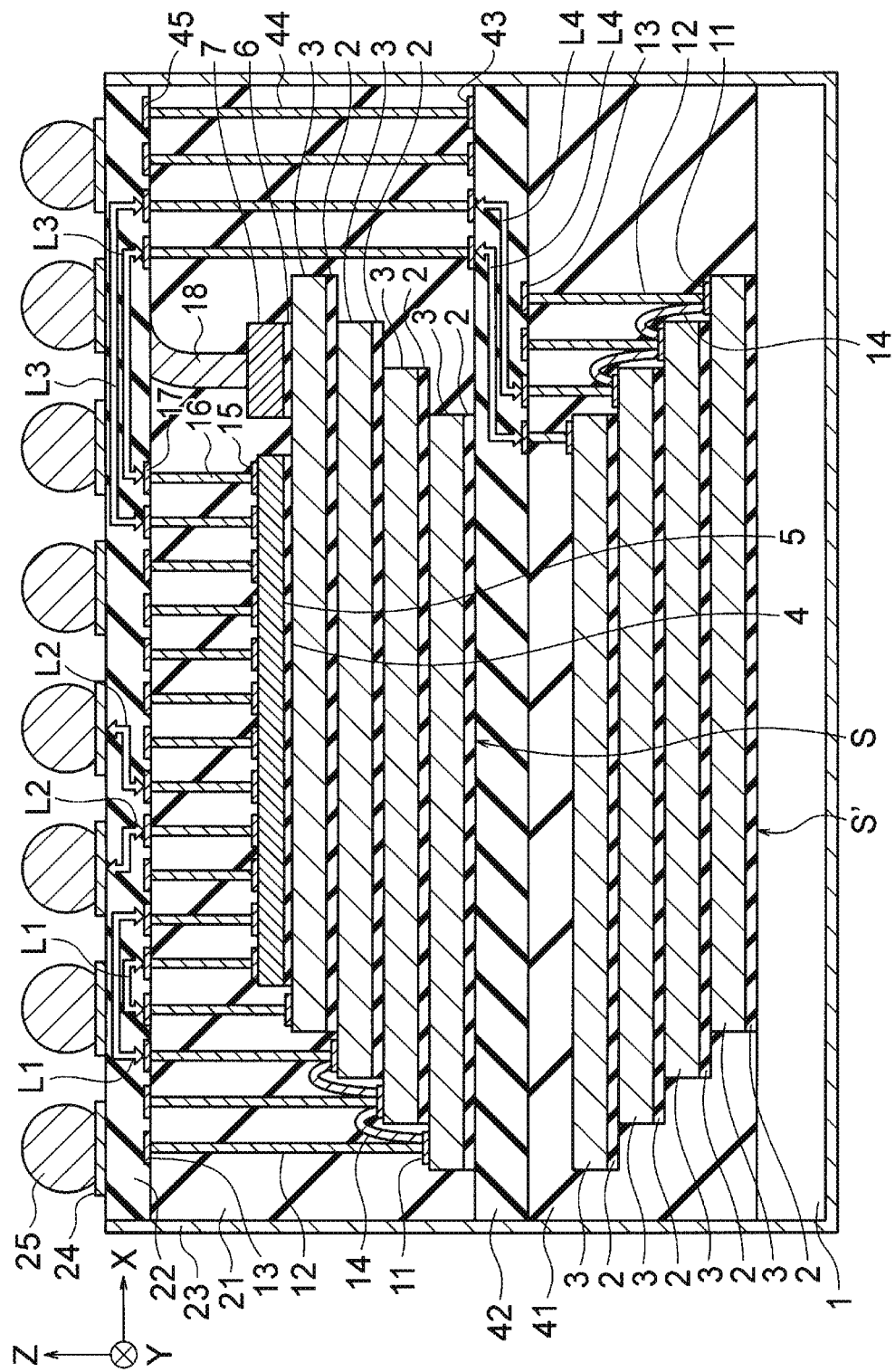
FIG. 24 is a cross-sectional view illustrating a structure of a semiconductor device according to a fifth embodiment.

FIG. 24 is a cross-sectional view illustrating a structure of a semiconductor device according to a fifth embodiment.

In addition to the components of the semiconductor device according to the first embodiment illustrated in FIG. 1, the semiconductor device according to the fifth embodiment illustrated in FIG. 24 further includes a stacked body S', a resin layer 41, a redistribution layer 42, a plurality of metal pads 43, a plurality of vertical wires 44, and a plurality of metal pads 45. The stacked body S' is an example of a second stacked body, and the redistribution layer 42 is an example of a second redistribution layer.

The stacked body S' includes a plurality of memory chips 3. The memory chips 3 are stacked one on the other on the substrate 1. The memory chips 3 are on the substrate 1 or another memory chip 3 via an adhesive layer 2. Characteristics of the adhesive layer 2 and the memory chips 3 in the stacked body S' can be substantially the same as the characteristics of the adhesive layer 2 and the memory chips 3 in the stacked body S.

The resin layer 41 is formed on the substrate 1 and the stacked body S'. Characteristics of the resin layer 41 can be the same as those of the resin layer 21. The redistribution layer 42 is disposed on the resin layer 41. Characteristics of the redistribution layer 42 can be substantially the same as those of the redistribution layer 22. The stacked body S' is disposed in the resin layer 41 between the substrate 1 and the redistribution layer 42.

The stacked body S is disposed on the redistribution layer 42. That is, the stacked body S is disposed on the substrate 1 via the resin layer 41 and the redistribution layer 42 without being directly disposed on the substrate 1. The resin layer 21 is formed on the redistribution layer 42 and the stacked body S. The redistribution layer 22 is disposed on the resin layer 21. The shield layer 23 is formed on a lower surface of the substrate 1 and on side surfaces of the substrate 1, the resin layer 41, the redistribution layer 42, the resin layer 21, and the redistribution layer 22.

In the semiconductor device according to the fifth embodiment, the metal pads 11, the vertical wires 12, the metal pads 13, and the bonding wires 14 are disposed on both the stacked body S and the stacked body S'. The metal pads 11 are disposed on each of the memory chips 3 of the stacked body S and the stacked body S'. In FIG. 24, one vertical wire 12 is connected to each metal pad 11 and each metal pad 13. Each of the bonding wires 14 is connected to two metal pads 11 on different memory chips 3 in the stacked body S or different memory chips 3 in the stacked body S'. The metal pads 11, the vertical wires 12, the metal pads 13, and the bonding wires 14 on the stacked body S' are disposed in the resin layer 41. Each of the vertical wires 12 on the stacked body S' is electrically connected to a memory chip 3 through a metal pad 11 and electrically connected to the redistribution layer 42 through a metal pad 13.

Each of the metal pads 43 is disposed on the redistribution layer 42. In FIG. 24, each vertical wire 44 is connected to one metal pad 43 and one metal pad 45. Accordingly, each of the vertical wires 44 includes a lower end electrically connected to the metal pad 43 and an upper end electrically connected to the metal pad 45. Each of the vertical wires 44 is electrically connected to the redistribution layer 42 through a metal pad 43 and electrically connected to the redistribution layer 22 through a metal pad 45. Each of the vertical wires 44 extends in the Z direction from a metal pad 11 to a metal pad 13, that is, extends in a direction perpendicular to the surface of the substrate 1. Each of the vertical wires 44 is formed of, for example, a metal such as gold (Au), silver (Ag), or copper (Cu).

FIG. 24 schematically illustrates a plurality of wirings L1 and L2 in the redistribution layer 22. Each of the wirings L1 electrically connects a vertical wire 12 and a metal pillar 16 to each other. Each of the wirings L2 electrically connects a metal pillar 16 and a metal bump 25 to each other.

FIG. 24 further schematically illustrates a plurality of wirings L3 in the redistribution layer 22; and a plurality of wirings L4 in the redistribution layer 42. Each of the wirings L3 electrically connects a vertical wire 44 and a metal pillar 16 to each other. Each of the wirings L4 electrically connects a vertical wire 12 and a vertical wire 44 to each other.

In the fifth embodiment, by providing the redistribution layer 42 between the substrate 1 and the redistribution layer 22, the length of each of the vertical wires 12 can be reduced. In FIG. 1, four memory chips 3 are stacked on the substrate 1, but in FIG. 24, eight memory chips 3 are stacked on the substrate 1. However, the average length of the vertical wires 12 illustrated in FIG. 24 is substantially the same as the average length of the vertical wires 12 illustrated in FIG. 1. Accordingly, in the fifth embodiment, the vertical wires 12 can be inhibited from being distorted as a result of an increased length.

The stacked body S includes a plurality of memory chips 3, and these memory chips 3 are stacked shifted or offset from each other in the X direction. Likewise, the stacked body S' includes a plurality of memory chips 3, and these memory chips are stacked shifted or offset from each other in the X direction. However, the memory chips 3 in the stacked body S are shifted in the +X direction, whereas the memory chips 3 in the stacked body S' are shifted in the −X direction. As a result, the occupied planar area of the stacked bodies S and S' can be reduced, and the size of the semiconductor device according to the fifth embodiment can be reduced from what might otherwise be the case.

The stacked body S according to the fifth embodiment has the same structure as that of the stacked body S according to the first embodiment. Alternatively, the stacked body S according to the fifth embodiment may have the same structure as that of the stacked body S according to the second, third, or fourth embodiment.

FIGS. 25 to 29 are cross-sectional views illustrating the method of manufacturing the semiconductor device according to the fifth embodiment.

Figure 25:
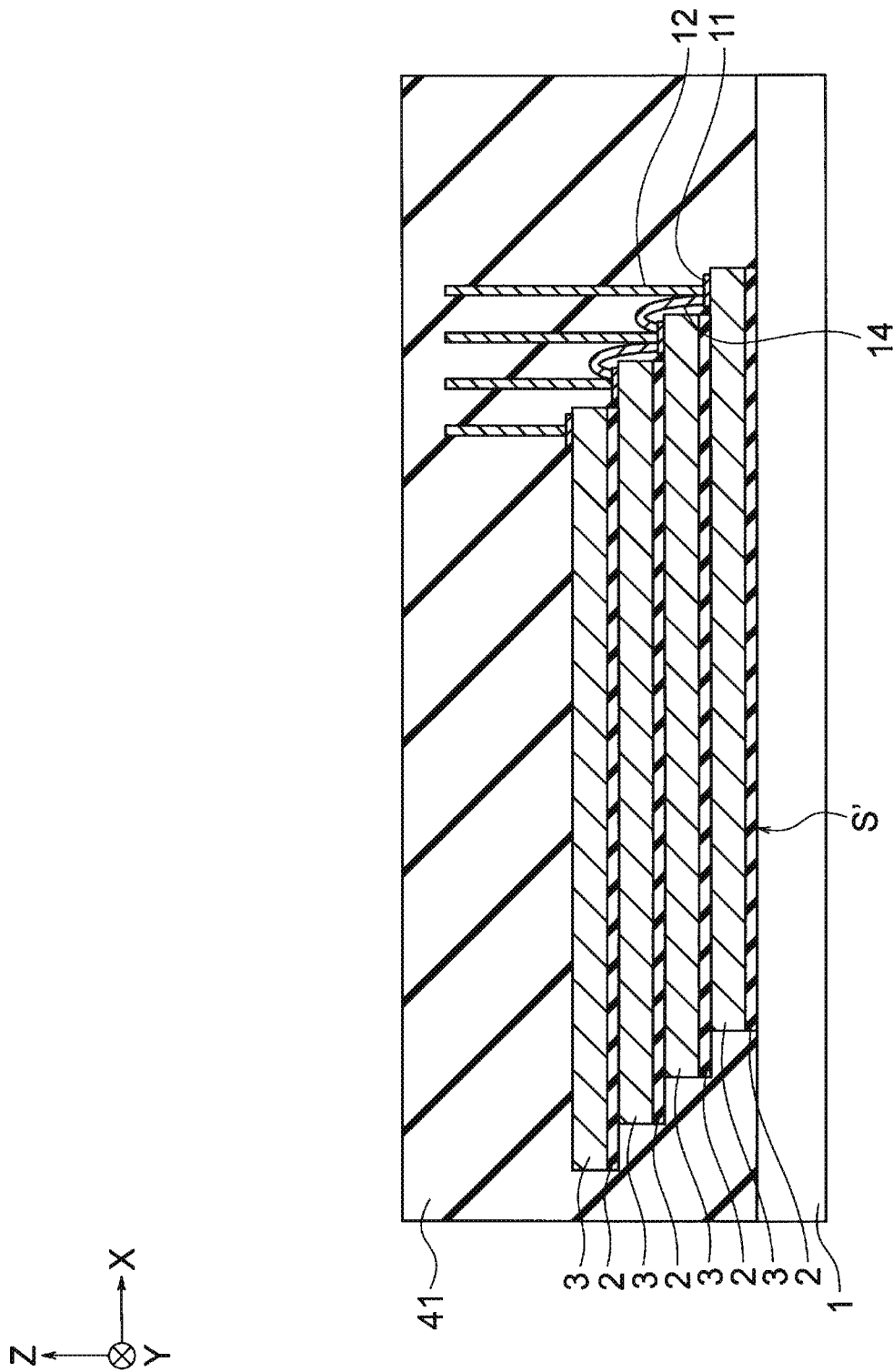
FIGS. 25 to 29 are cross-sectional views illustrating aspects related to a method of manufacturing a semiconductor device according to a fifth embodiment.

First, the substrate 1 is prepared, and the stacked body S' is formed on the substrate 1 (FIG. 25). The stacked body S' is formed by stacking the plurality of memory chips 3 on the substrate 1.

Next, the plurality of metal pads 11, the plurality of vertical wires 12, and the plurality of bonding wires 14 are formed on the stacked body S' (FIG. 25).

Next, the resin layer 41 is formed on the substrate 1 and the stacked body S' (FIG. 25). As a result, the stacked body S' is covered with the resin layer 41. Likewise, the metal pads 11, the vertical wires 12, and the bonding wires 14 are also covered with the resin layer 41.

Figure 26:
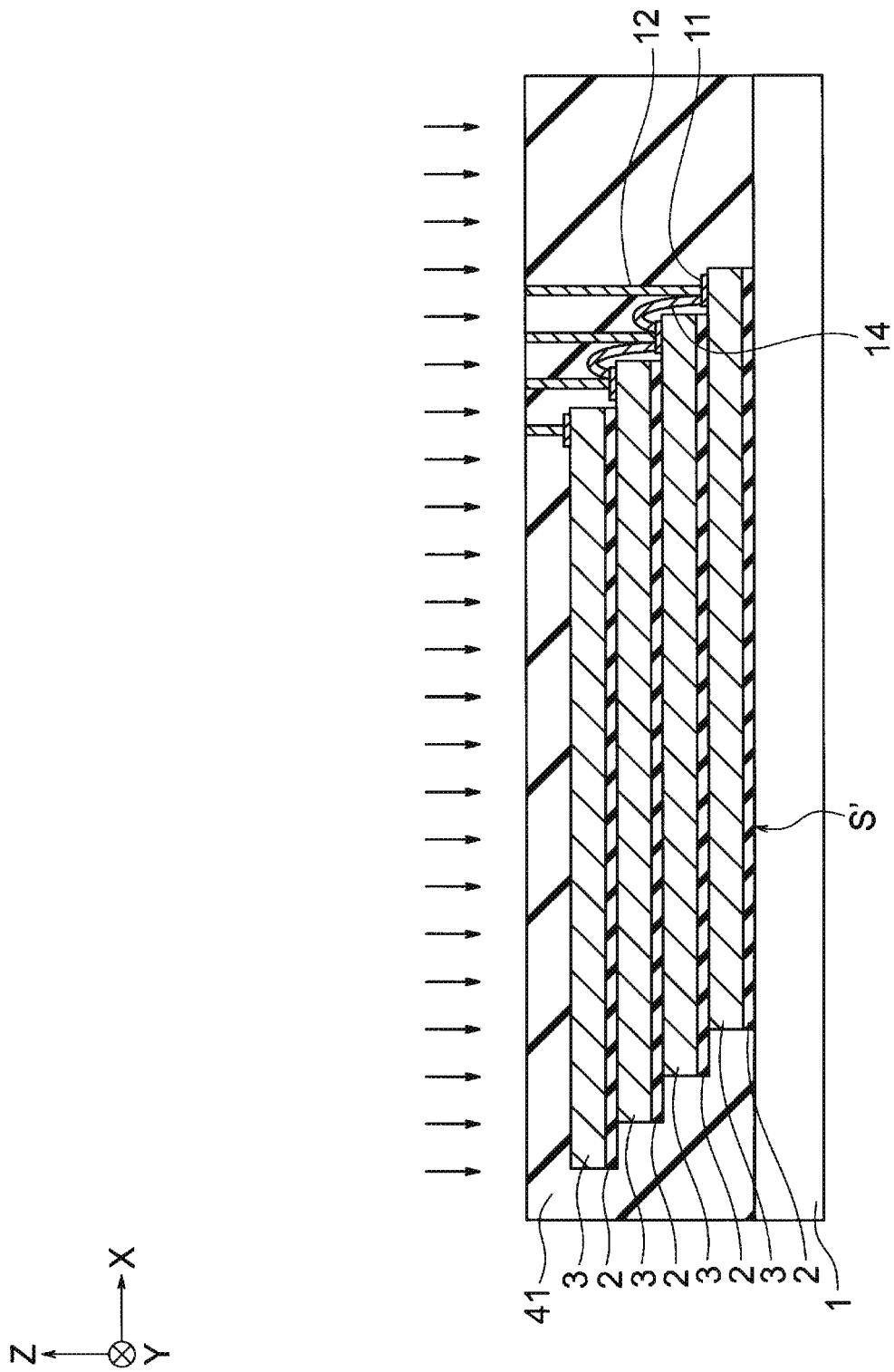

Next, the upper surface of the resin layer 41 is polished or ground (FIG. 26). The resin layer 41 is polished or ground until the vertical wires 12 are exposed from the upper surface of the resin layer 41. The polishing and grinding of the resin layer 41 according to the fifth embodiment ends before the memory chips 3 are exposed from the upper surface of the resin layer 41.

Figure 27:
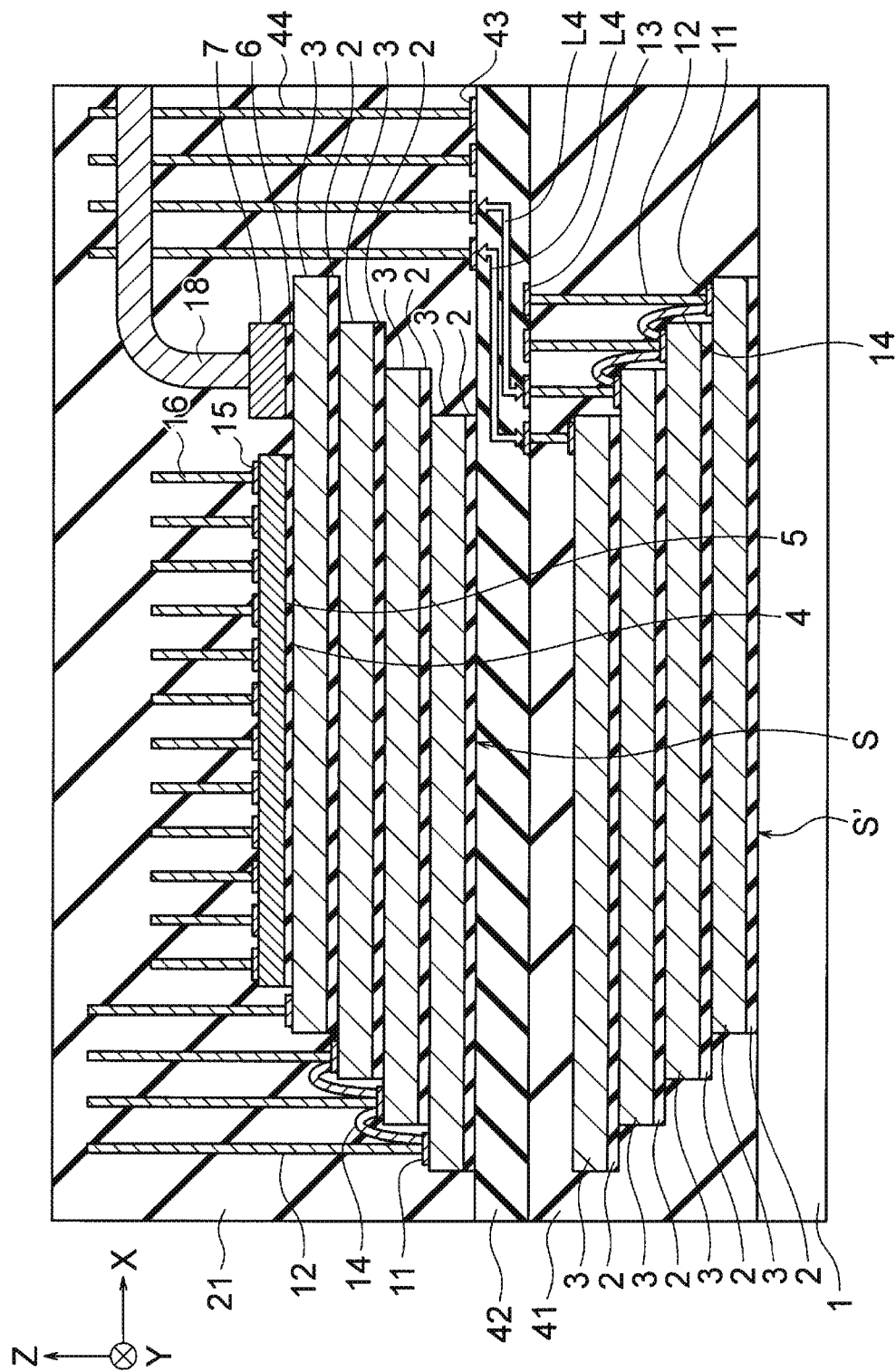
Figure 28:
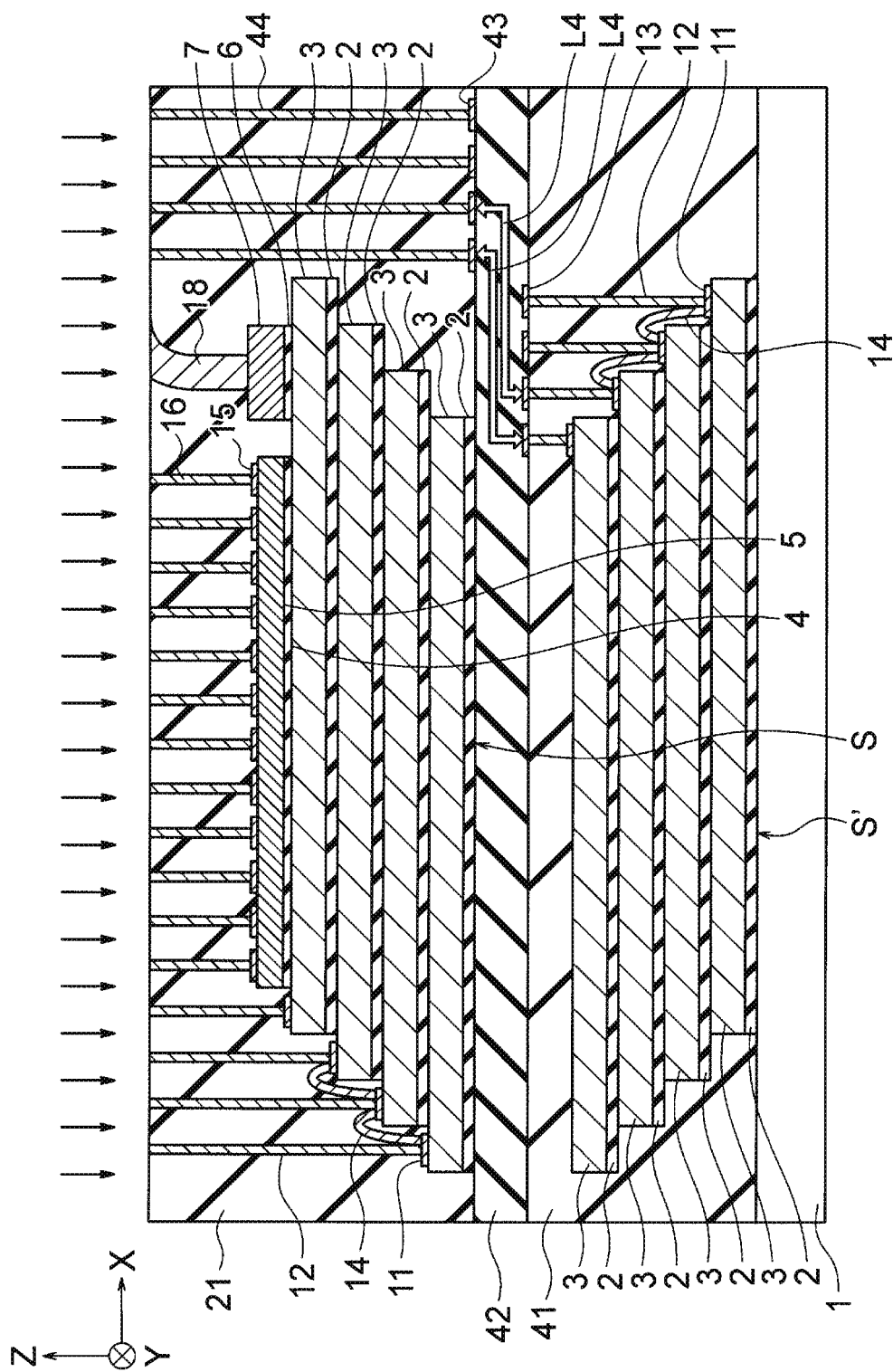

Next, the plurality of metal pads 13 and the redistribution layer 42 are formed or placed on the resin layer 41, and the stacked body S is formed on the redistribution layer (FIG. 27). The stacked body S is formed by stacking the plurality of memory chips 3 on the redistribution layer 42 and stacking the controller chip 5 and the metal piece 7 on the uppermost memory chip 3.

Next, the plurality of metal pads 11, the plurality of vertical wires 12, the plurality of bonding wires 14, the plurality of metal pads 15, the plurality of metal pillars 16, and the bonding wire 18 are formed on the stacked body S (FIG. 27). The bonding wire 18 is connected to the metal piece 7 of the stacked body S as illustrated in FIG. 27 and the metal piece 7 of another stacked body S. As a result, the stacked bodies S are connected to each other through the bonding wires 18.

Next, the plurality of metal pads 43 and the plurality of vertical wires 44 are formed on the redistribution layer 42 (FIG. 27). Each of the vertical wires 44 is connected to redistribution layer 42 through a metal pad 43. The vertical wires 12 and the vertical wires 44 are electrically connected to each other through the wirings L4.

Next, the resin layer 21 is formed on the redistribution layer 42 and the stacked body S (FIG. 27). As a result, the stacked body S is covered with the resin layer 21. Likewise, the metal pads 11, the vertical wires 12, the bonding wires 14, the metal pads 15, the metal pillars 16, the bonding wire 18, the metal pads 43, and the vertical wires 44 are also covered with the resin layer 21.

In FIG. 27, in order to more easily understand a positional relationship between the vertical wires 44 and the bonding wire 18, the vertical wires 44 and the bonding wire 18 are illustrated as overlapping each other. However, the vertical wires 44 and the bonding wire 18 according to the fifth embodiment are not in actual contact with each other.

Next, the upper surface of the resin layer 21 is polished or ground (FIG. 28) until the vertical wires 12, the metal pillars 16, the bonding wire 18, and the vertical wires 44 are exposed from the upper surface of the resin layer 21. The polishing or the grinding of the resin layer 21 according to the fifth embodiment is performed until the bonding wire 18 is cut, and ends before the controller chip 5 and the metal piece 7 are exposed from the upper surface of the resin layer 21.

Figure 29:
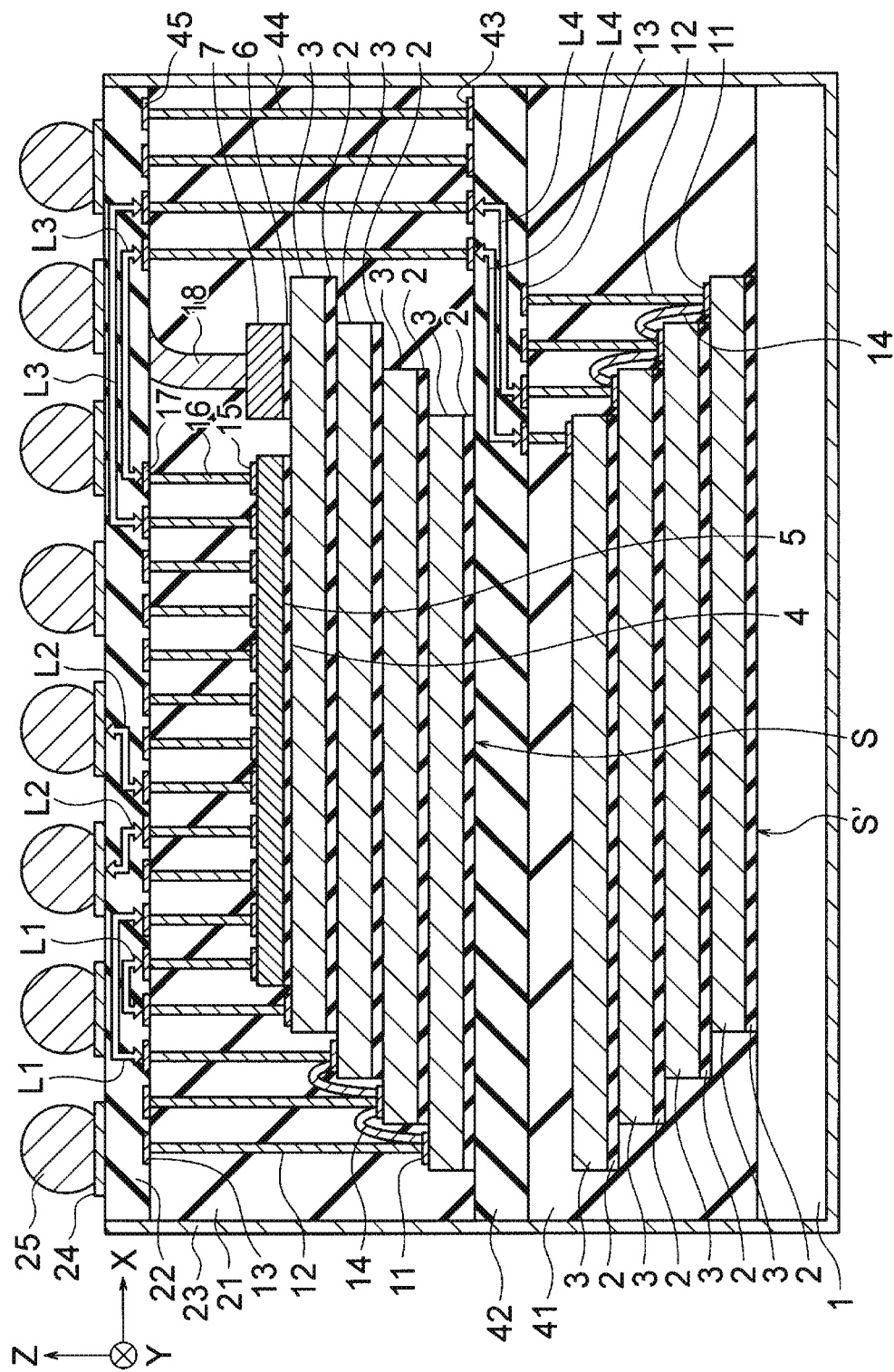

Next, the plurality of metal pads 13, the plurality of metal pads 17, and the redistribution layer 22 are formed on the resin layer 21 (FIG. 29). The vertical wires 12 and the metal pillars 16 are electrically connected to each other through the wirings L1, and the vertical wires 44 and the metal pillars 16 are electrically connected to each other through the wirings L3. Next, the substrate 1, the resin layer 41, the redistribution layer 42, the resin layer 21, and the redistribution layer 22 are cut (diced) at the scribe region R2 (FIG. 29). As a result, the substrate 1, the resin layer 41, the redistribution layer 42, the resin layer 21, and the redistribution layer 22 are divided into separate device regions R1.

Next, on each of the device regions R1, the shield layer 23 is formed on the lower surface of the substrate 1 and on the side surfaces of the substrate 1, the resin layer 41, the redistribution layer 42, the resin layer 21, and the redistribution layer 22 (FIG. 29). Next, the plurality of metal pads 24 and the plurality of metal bumps 25 are formed on the redistribution layer 22 (FIG. 29). The metal pillars 16 and the metal bumps 25 are electrically connected to each other through the wirings L2. The bonding wire 18 according to the fifth embodiment is not electrically connected to the wirings in the redistribution layer 22 and is electrically insulated from the wirings in the redistribution layer 22. In this way, the semiconductor device according to the fifth embodiment is manufactured.

In the fifth embodiment, the resin layer 21 can be appropriately processed to a correct thickness as in the first to fourth embodiments by using the bonding wires 18 to detect the end point of polishing or grinding.

In the fifth embodiment, a metal piece 7 and a bonding wire 18 may also be located on the stacked body S'. As a result, the resin layer 41 can be appropriately formed to a correct thickness in a manner similar to the processing of the resin layer 21. In this case, the metal piece 7 and the bonding wire 18 on the stacked body S' can be located, for example, with the same configuration as that of the metal piece 7 and the bonding wire 18 on the stacked body S according to any one of the first to fourth embodiments.

Sixth Embodiment

Figure 30:
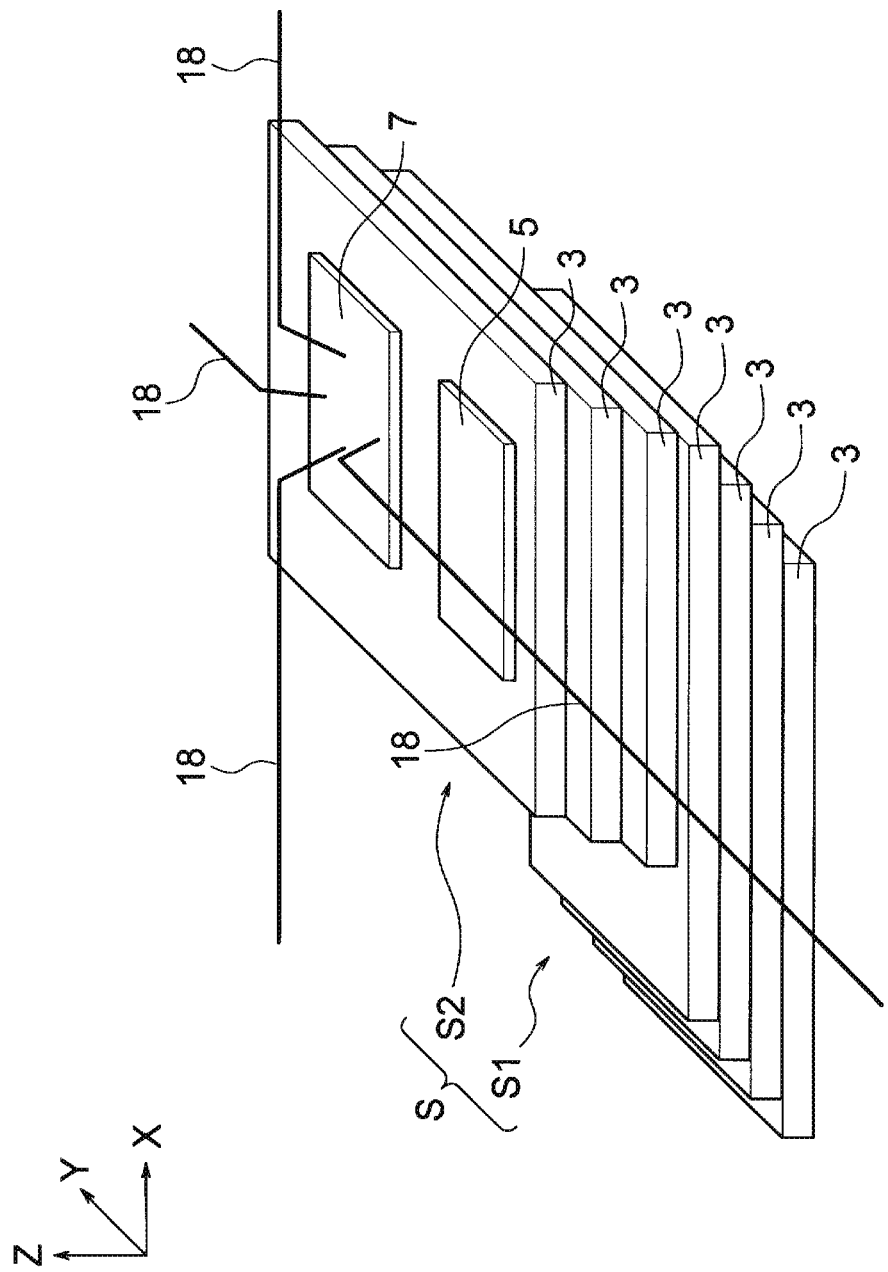
FIG. 30 is a perspective view illustrating aspects related to a method of manufacturing a semiconductor device according to a sixth embodiment.

FIG. 30 is a perspective view illustrating a method of manufacturing a semiconductor device according to a sixth embodiment.

FIG. 30 illustrates the stacked body S and the plurality of bonding wires 18 formed in the step of FIG. 2A. FIG. 30 corresponds in general to FIG. 3 related to the first embodiment. FIG. 30 illustrates just one stacked body S among the plurality of stacked bodies S formed in the step of FIG. 2A. The stacked bodies S are arranged in a shape of a two-dimensional array (quadrangular grid) where the stacked bodies S are adjacent to each other in the X direction and the Y direction. In addition, each of the bonding wires 18 illustrated in FIG. 30 is connected to the metal piece 7 of the illustrated stacked body S and a metal piece 7 of another stacked body S.

The stacked body S illustrated in FIG. 30 includes a lower stacked body S1 on the substrate 1 and an upper stacked body S2 on the lower stacked body S1. The lower stacked body S1 includes a plurality of memory chips 3 stacked on the substrate 1. The upper stacked body S2 includes a plurality of memory chips 3 stacked on the lower stacked body S1. The controller chip 5 is stacked on the uppermost memory chip 3 in the upper stacked body S2, and the metal piece 7 is stacked on the uppermost memory chip 3 in the upper stacked body S2.

In the sixth embodiment, positions of the plurality of memory chips 3 in the lower stacked body S1 are shifted in plan view from each other in the X direction. The positions of the plurality of memory chips 3 in the upper stacked body S2 are shifted from each other in plan view in the Y direction. As a result, the occupied planar shape of the stacked body S can be configured with good balance in the X and Y directions rather than just one or the other direction.

The upper stacked body S2 according to the sixth embodiment has the same structure as that of the stacked body S according to the first embodiment. Alternatively, the stacked body S according to the sixth embodiment may have the same structure as that of the stacked body S according to the second, third, fourth, or fifth embodiment.

In the sixth embodiment, the resin layer 21 can be appropriately formed as in the first to fifth embodiments by using the bonding wires 18 to detect the end point of polishing or grinding.

Modification Example of First Embodiment

Figure 31B:
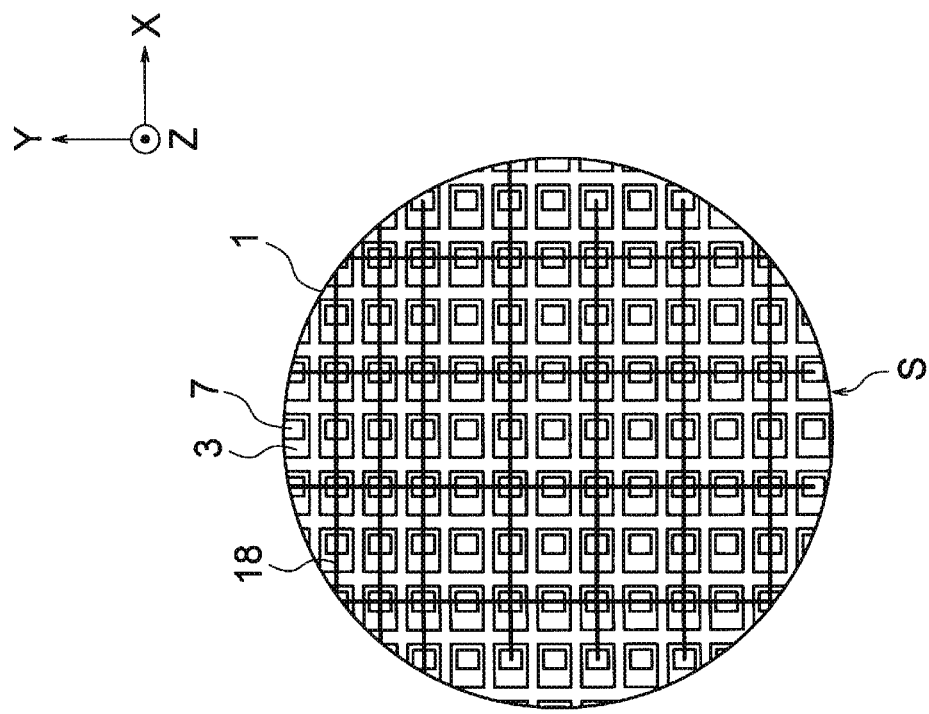
FIGS. 31A and 31B are plan views illustrating aspects related to a method of manufacturing a semiconductor device according to a modification example of a first embodiment.
Figure 31A:
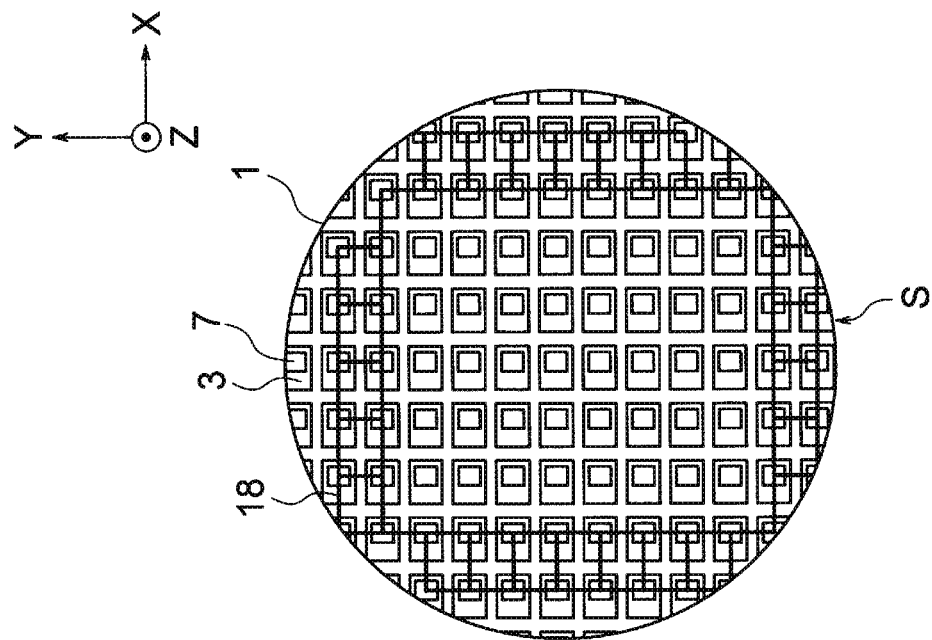

FIGS. 31A and 31B are plan views illustrating a method of manufacturing a semiconductor device according to a modification example of the first embodiment.

In FIG. 31A illustrates the substrate 1 after the bonding wires 18 are formed in the step of FIG. 2A. In FIG. 31A, the bonding wires 18 are connected to only some of the stacked bodies S on the substrate 1. As a result, the total number of bonding wires 18 located on the substrate 1 can be reduced. In this case, the metal pieces 7 do not need to be located on the stacked bodies S where the bonding wires 18 are not located.

FIG. 31B also illustrates the substrate 1 after the bonding wires 18 are located in the step of FIG. 2A. In FIG. 31B, the bonding wires 18 are also located on only some of the stacked bodies S on the substrate 1. The stacked bodies S without the bonding wires 18 may be selected using any method or arbitrarily.

Figure 32:
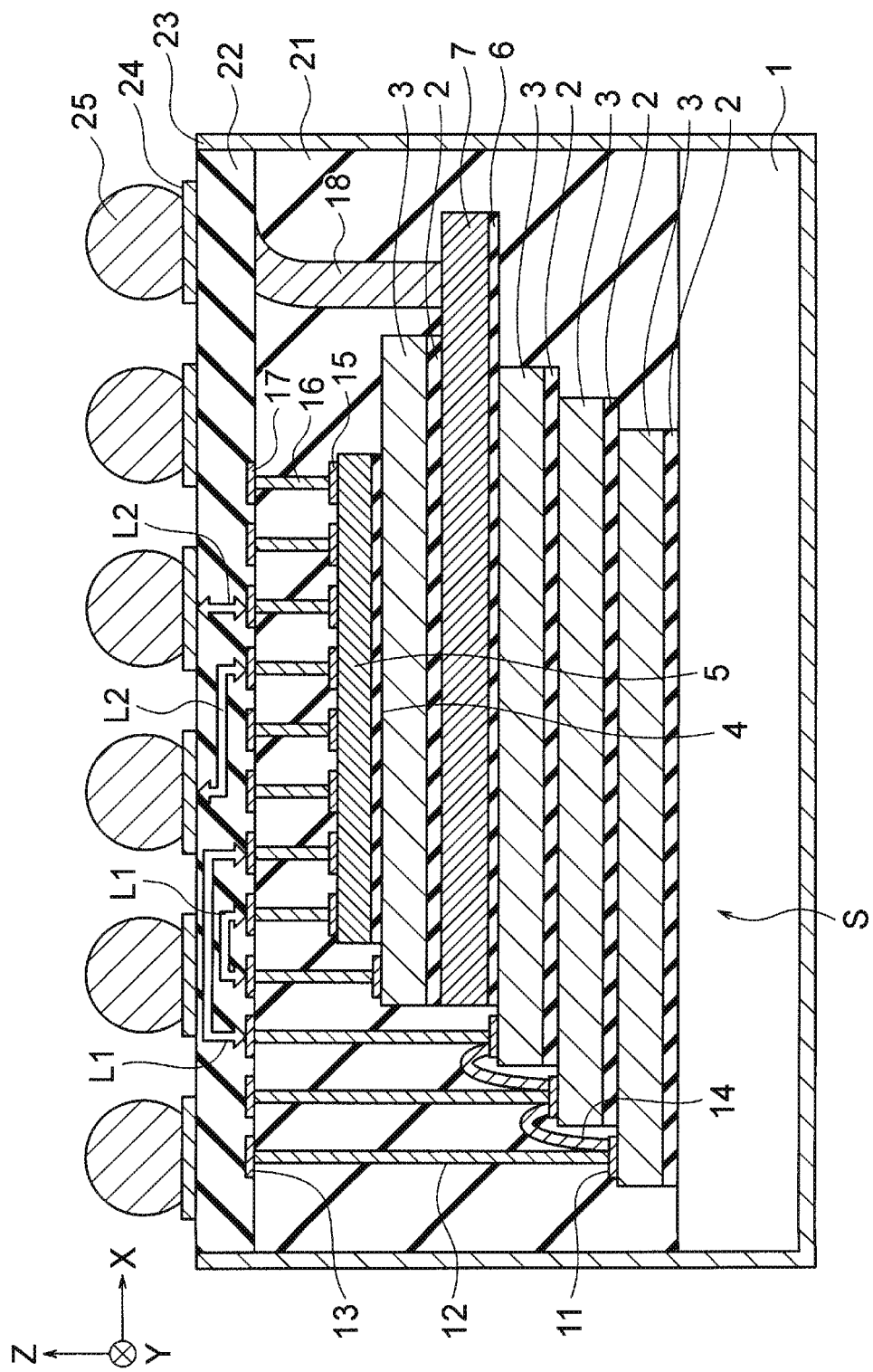
FIG. 32 is a cross-sectional view illustrating a structure of a semiconductor device according to another modification example of a first embodiment.

FIG. 32 is a cross-sectional view illustrating a structure of a semiconductor device according to another modification example of the first embodiment.

The semiconductor device according to the modification example illustrated in FIG. 32 includes substantially the same components as the semiconductor device according to the first embodiment illustrated in FIG. 1. However, the metal piece 7 according to this modification example is disposed between two memory chips 3. In this way, the metal piece 7 may be located on a memory chip 3 other than the uppermost memory chip 3.

Figure 33:
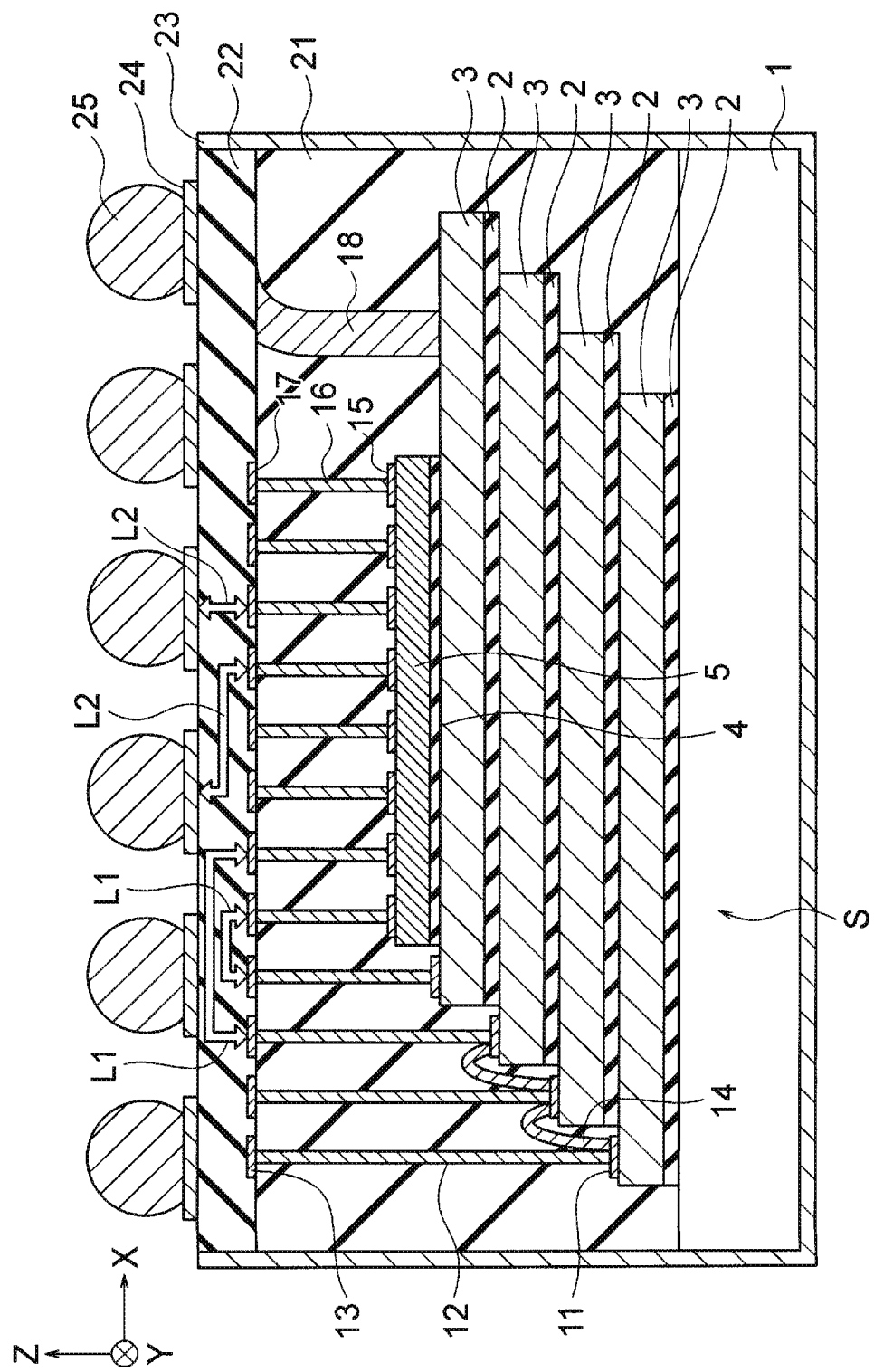
FIG. 33 is a cross-sectional view illustrating a semiconductor device according to still another modification example of a first embodiment.

FIG. 33 is a cross-sectional view illustrating a structure of a semiconductor device according to still another modification example of the first embodiment.

The semiconductor device according to the modification example illustrated in FIG. 33 has a structure corresponding to the removal of the metal piece 7 from the semiconductor device according to the first embodiment illustrated in FIG. 1. Accordingly, the bonding wire 18 in this modification example is directly located on the uppermost memory chip 3. The bonding wire 18 according to this modification example may be directly located on a memory chip 3 other than the uppermost memory chip 3.

Figure 34A:
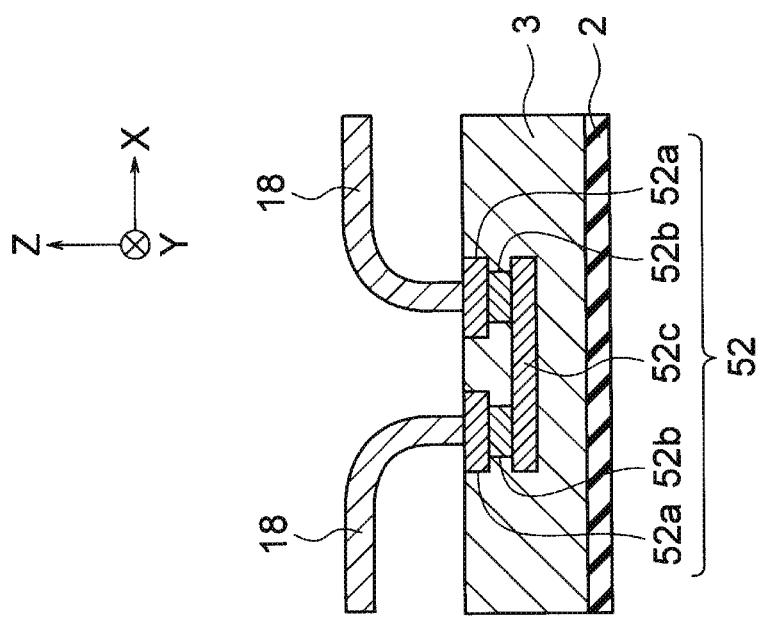
FIGS. 34A and 34B are cross-sectional views illustrating an example of the method of manufacturing the semiconductor device illustrated in FIG. 33.
Figure 34B:
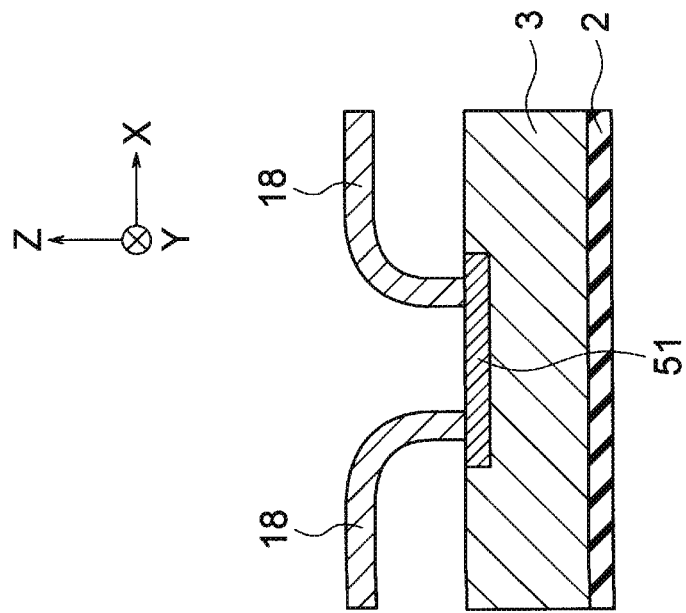

FIGS. 34A and 34B are cross-sectional views illustrating aspects of the method of manufacturing the semiconductor device illustrated in FIG. 33.

FIG. 34A illustrates a first example of a structure of the uppermost memory chip 3. The uppermost memory chip 3 includes a wiring 51 in the memory chip 3. The wiring 51 is a bonding pad formed of, for example, a metal such as aluminum (Al) or copper (Cu). In this example, a plurality of bonding wires 18 are located on the wiring 51. Thus, the resin layer 21 can be polished or ground in a manner similar to the examples in which bonding wires 18 are located on the metal piece 7 rather than the wiring 51.

FIG. 34B illustrates a second example of the structure of the uppermost memory chip 3. The uppermost memory chip 3 according to this second example includes a wiring 52 in the memory chip 3. The wiring 52 comprises two wirings 52a and two via plugs 52b in a wiring layer and one wiring 52c in another wiring layer. Each of the wirings 52a, the via plugs 52b, and the wiring 52c is formed of, for example, a metal such as aluminum (Al), copper (Cu), or tungsten (W). In this example, a plurality of bonding wires 18 are located on the wiring 52. Thus, the resin layer 21 can be polished or ground in a manner similar to the examples in which the bonding wires 18 are located on the metal piece 7.

Figure 35:
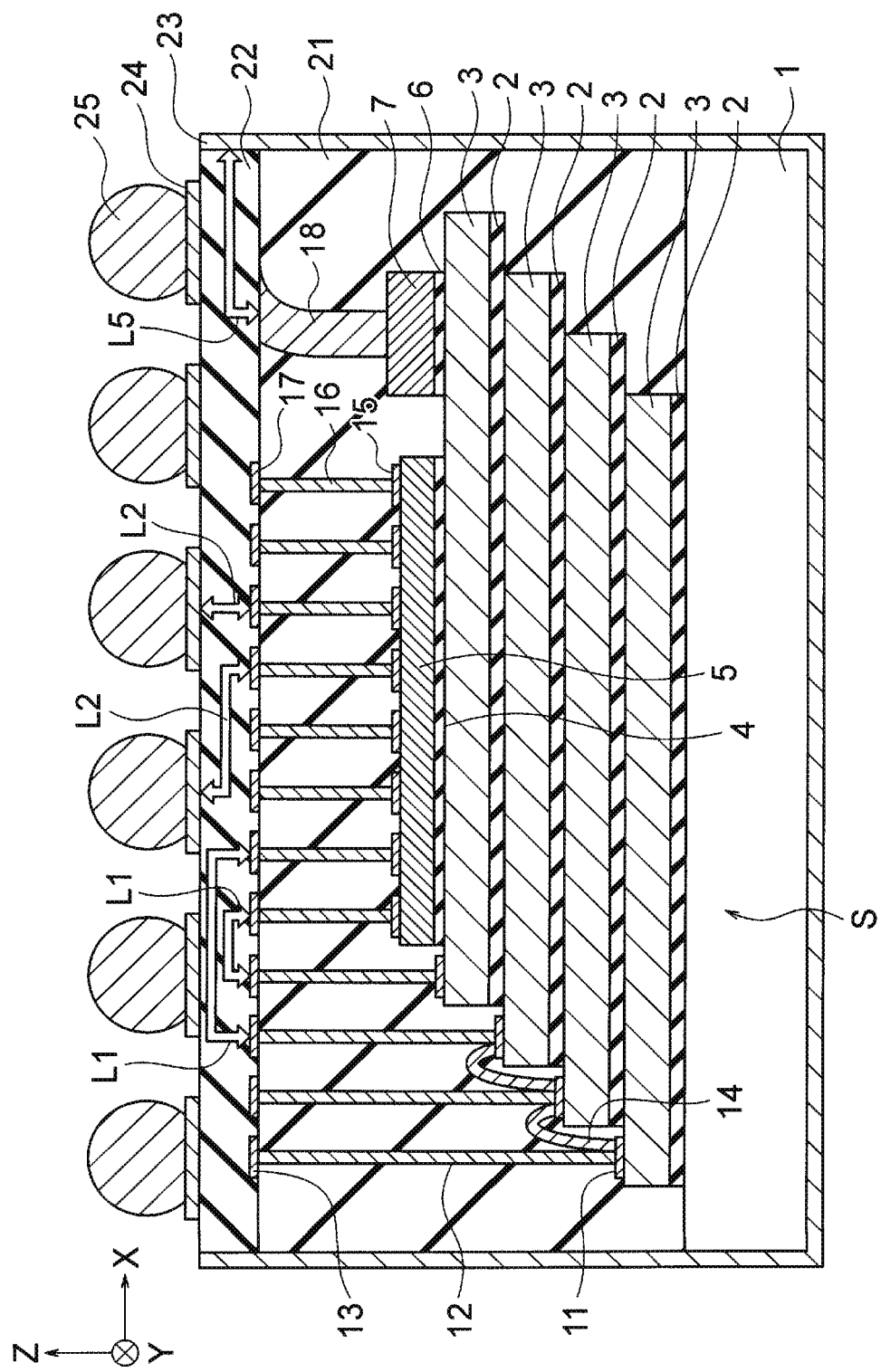
FIG. 35 is a cross-sectional view illustrating a semiconductor device according to yet another modification example of the first embodiment.

FIG. 35 is a cross-sectional view illustrating a structure of a semiconductor device according to yet another modification example of the first embodiment.

The semiconductor device according to the modification example illustrated in FIG. 35 includes the same components as the semiconductor device according to the first embodiment illustrated in FIG. 1. However, in this modification, the redistribution layer 22 includes a wiring L5 that electrically connects the bonding wire 18 and the shield layer 23 to each other. By electrically connecting the memory chips 3 in the stacked body S to the metal piece 7, the potential of the shield layer 23 can be supplied into the memory chips 3 through the bonding wire 18. That is, the ground potential can be supplied into the memory chips 3 through the bonding wire 18.

This way, the bonding wire 18 may be effectively used as a wiring in the semiconductor device. In FIG. 35, the bonding wire 18 functions as a ground wiring connected to the shield layer 23 in the semiconductor device. The bonding wire 18 may be used as a wiring for another application within the semiconductor device besides a ground wire or shield connection.

The structures or methods of the modification examples are also applicable to each of the embodiments other than the first embodiment. That is, the various modifications may be combined with any of the disclosed embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor device, comprising:
  a substrate;
  a stacked body including a plurality of semiconductor chips stacked on the substrate along a first direction;
  a metal plate on a first semiconductor chip in the plurality of semiconductor chips;
  a resin layer covering the stacked body and the metal plate, the resin layer being above the stacked body and the metal plate in the first direction;
  a first wire having a first end directly connected to the metal plate in the resin layer, the first wire extending from the metal plate to an upper surface of the resin layer, a second end of the first wire being closer to the upper surface of the resin layer than the first end;
  a second wire connected to a terminal pad on the first semiconductor chip and extending in the resin layer in the first direction, the second wire being electrically connected to the first semiconductor chip; and
  an adhesive layer between the metal plate and the first semiconductor chip.

2. The semiconductor device according claim 1, further comprising:
a first redistribution layer on the resin layer and electrically connected to the stacked body via at least the second wire.

3. The semiconductor device according to claim 2, further comprising:
a second redistribution layer between the substrate and the stacked body and electrically connected to the first redistribution layer; and
a second stacked body including a plurality of semiconductor chips stacked on the substrate, the second stacked body being between the substrate and the second redistribution layer and electrically connected to the second redistribution layer.

4. The semiconductor device according to claim 1, wherein
the stacked body comprises a lower stacked body and an upper stacked body on the lower stacked body, the lower stacked body being between the upper stacked body and the substrate in the first direction,
the semiconductor chips in the lower stacked body are shifted in plan view from each other in a second direction parallel to the substrate, and
the semiconductor chips in the upper stacked body are shifted in plan view from each other in a third direction parallel to the substrate but intersecting the second direction.

5. The semiconductor device according to claim 1, further comprising:
a shield layer on a side surface of the resin layer; and
the first wire is electrically connected to the shield layer.

6. The semiconductor device according to claim 1, wherein the first semiconductor chip is the uppermost semiconductor chip of the plurality of semiconductor chips in the stacked body.

7. The semiconductor device according to claim 1, wherein no other semiconductor chip in the plurality of semiconductor chips is between the metal plate and the first semiconductor chip.

8. The semiconductor device according to claim 7, wherein the metal plate is adhered to an upper surface of the first semiconductor chip.

9. The semiconductor device according to claim 1, wherein no semiconductor chip in the plurality of semiconductor chips of the stacked body is between the metal plate and the upper surface of the resin layer in the first direction.

10. The semiconductor device according to claim 1, wherein the first wire and the second wire have different wire diameters.

11. The semiconductor device according to claim 1, wherein the second end of the first wire is at the upper surface of the resin layer.

12. The semiconductor device according to claim 1, wherein the second end of the first wire is flush with the upper surface of the resin layer.

13. The semiconductor device according to claim 12, wherein the second end of the first wire does not connect to a metal pad on the upper surface of the resin layer.

14. The semiconductor device according to claim 1, wherein the first wire and the second wire are formed of different materials.

15. The semiconductor device according to claim 1, further comprising:
a second semiconductor chip above the metal plate in the first direction, wherein
the second semiconductor chip has a planar area that is less than a planar area of the metal plate.

16. The semiconductor device according to claim 1, further comprising:
a redistribution layer on the upper surface of the resin layer, wherein
the second wire connects to a first metal pad of the redistribution layer.

17. The semiconductor device according to claim 16, wherein the second end of the first wire is connected to a portion of the redistribution layer.

18. The semiconductor device according to claim 1, wherein the metal plate is below the upper surface of the resin layer in the first direction.

19. The semiconductor device according to claim 1, wherein the adhesive layer is a die attachment film.

20. A semiconductor device, comprising:
a substrate;
a stacked body including a plurality of semiconductor chips stacked on the substrate along a first direction;
a metal plate on a first semiconductor chip in the plurality of semiconductor chips;
a second semiconductor chip on the first semiconductor chip;
a resin layer covering the stacked body and the metal plate, the resin layer being above the stacked body and the metal plate in the first direction;
a first wire having a first end directly connected to the metal plate in the resin layer, the first wire extending from the metal plate to an upper surface of the resin layer, a second end of the first wire being closer to the upper surface of the resin layer than the first end; and
a second wire connected to a terminal pad on the first semiconductor chip and extending in the resin layer in the first direction, the second wire being electrically connected to the first semiconductor chip, wherein
the second semiconductor chip has a planar area that is less than a planar area of the first semiconductor chip, and
the second semiconductor chip and the metal plate are both on a surface of the first semiconductor chip.

* * * * *